United States Patent
Inoue et al.

(10) Patent No.: US 9,420,380 B2
(45) Date of Patent: Aug. 16, 2016

(54) ACOUSTIC TRANSDUCER

(71) Applicant: OMRON Corporation, Kyoto-shi, Kyoto (JP)

(72) Inventors: Tadashi Inoue, Kyoto (JP); Takashi Kasai, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/426,895

(22) PCT Filed: Aug. 12, 2013

(86) PCT No.: PCT/JP2013/071831
§ 371 (c)(1),
(2) Date: Mar. 9, 2015

(87) PCT Pub. No.: WO2014/041944
PCT Pub. Date: Mar. 20, 2014

(65) Prior Publication Data
US 2015/0230027 A1    Aug. 13, 2015

(30) Foreign Application Priority Data

Sep. 14, 2012   (JP) .................................. 2012-202782

(51) Int. Cl.
| | |
|---|---|
| *H04R 25/00* | (2006.01) |
| *H04R 19/00* | (2006.01) |
| *H04R 7/26* | (2006.01) |
| *H04R 31/00* | (2006.01) |
| *B81B 3/00* | (2006.01) |
| *H04R 3/00* | (2006.01) |

(52) U.S. Cl.
CPC ................ *H04R 19/00* (2013.01); *B81B 3/001* (2013.01); *H04R 7/26* (2013.01); *H04R 19/005* (2013.01); *H04R 31/003* (2013.01); *B81B 2201/0257* (2013.01); *B81B 2203/0127* (2013.01); *H04R 2207/021* (2013.01)

(58) Field of Classification Search
CPC .... H04R 19/005; H04R 19/016; H04R 19/04; H04R 1/406
USPC ......... 381/174–175, 191, 386, 423, 113, 116; 257/416, 415
See application file for complete search history.

(56) References Cited

U.S. PATENT DOCUMENTS

2014/0210020 A1*  7/2014  Dehe ...................... B81B 3/007
                                                        257/416

FOREIGN PATENT DOCUMENTS

WO              02/15636 A2      2/2002

OTHER PUBLICATIONS

International Search Report issued in PCT/JP2013/071831 mailed on Sep. 24, 2013 (2 pages).

* cited by examiner

*Primary Examiner* — Sunita Joshi
(74) *Attorney, Agent, or Firm* — Osha Liang LLP

(57) ABSTRACT

An acoustic transducer has a substrate having an opening in an upper surface thereof, a vibration electrode plate disposed above the substrate, and having an outer edge thereof facing the upper surface of the substrate with a gap therebetween, a fixed electrode plate facing the vibration electrode plate, and a plurality of projections protruding on a lower surface of the outer edge of the vibration electrode plate. The vibration electrode plate covers an upper side of the opening. The plurality of projections are disposed so as to not be positioned along a straight line or a curved line parallel to an edge of the opening in at least a part of one or at least two arrays formed on the lower surface of the outer edge.

13 Claims, 24 Drawing Sheets

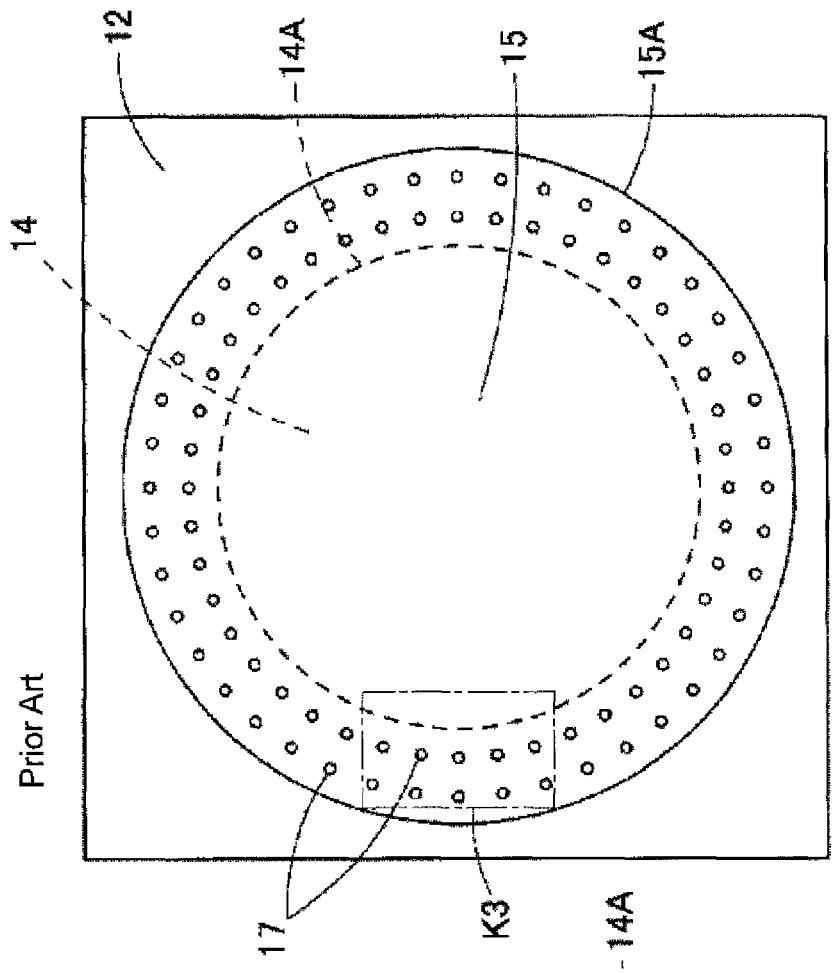
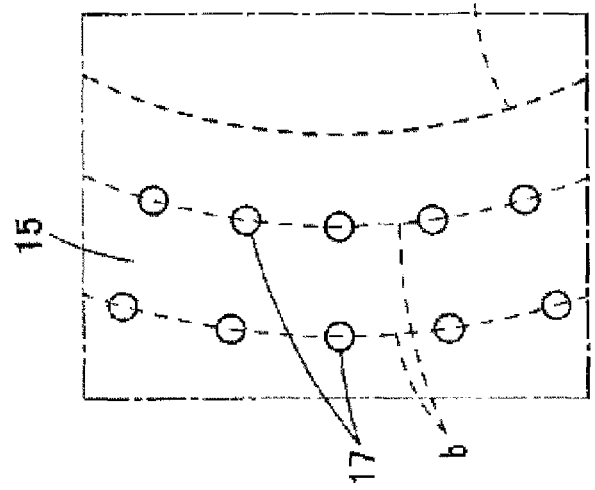
Fig. 10(A) Prior Art
Fig. 10(B) Prior Art

ACOUSTIC TRANSDUCER

CROSS-REFERENCE TO RELATED APPLICATIONS

This application is a national phase application PCT Patent Application No. PCT/JP2013/071831 filed Aug. 12, 2013, which claims priority from Japanese Patent Application No. 2012-202782 filed on Sep. 14, 2012, the entire content of which is hereby incorporated by reference.

BACKGROUND

1. Technical Field

The present invention relates to an acoustic transducer. More specifically, the present invention relates to a small-sized acoustic transducer for an acoustic sensor (microphone), a speaker, or the like manufactured by utilizing a MEMS technology.

2. Related Art

FIG. 1 is a schematic sectional view illustrating a general capacitance type acoustic sensor 11. In the acoustic sensor 11, a diaphragm 15 (vibration electrode plate) and a fixed electrode plate 19 that face each other at an interval are disposed on the upper surface of a silicon substrate 12. The silicon substrate 12 is provided with a chamber 13 (hollow) that vertically penetrates, and the diaphragm 15 covers an opening 14 of the chamber 13 in the upper surface of the silicon substrate 12. The outer edge of the diaphragm 15 faces the upper surface of the silicon substrate 12 with a narrow gap sandwiched therebetween. This gap is a vent hole 16 for communicating the upper surface side of the diaphragm 15 with the lower surface side. An insulating protective film 18 provided on the upper surface of the silicon substrate 12 covers the whole of the diaphragm 15. The fixed electrode plate 19 is provided on the lower surface of the protective film 18 so as to face the diaphragm 15. When the diaphragm 15 vibrates by acoustic vibration, electrostatic capacitance value between the diaphragm 15 and the fixed electrode plate 19 changes, the acoustic vibration is converted into an electric signal.

In the capacitance type acoustic sensor 11 as illustrated in FIG. 1, in order to prevent the diaphragm 15 from sticking to and disabling to separate from the fixed electrode plate 19, stoppers 20 provided in the protective film 18 protrude from the fixed electrode plate 19. The stoppers 20 are provided, so that when the diaphragm 15 is largely displaced, the diaphragm 15 first hits the stoppers 20, and the diaphragm 15 comes into contact with the fixed electrode plate 19, thereby preventing the sticking.

Furthermore, when the diaphragm 15 is largely displaced, the diaphragm 15 presses against the silicon substrate 12, thereby causing a mute phenomenon, or a phenomenon in which the diaphragm 15 sticks to the upper surface of the silicon substrate 12 and does not separate from the upper surface of the silicon substrate 12. There is known an acoustic sensor provided with projections 17 on the lower surface of the outer edge of a diaphragm 15. Therese projections 17 aim to obtain effects similar to the stoppers 20. The acoustic sensor provided with such projections on the lower surface of the diaphragm is disclosed in, for example, Patent Document 1.

The sticking is a phenomenon in which the diaphragm sticks to the fixed electrode plate, the substrate upper surface, or the like, and does not separate from the fixed electrode plate, the substrate upper surface, or the like, which is caused by the large displacement of the diaphragm and the collision with the fixed electrode plate or the substrate, or also caused by surface tension of water which enters between the diaphragm and the fixed electrode plate or the substrate upper surface in a step of manufacturing the acoustic sensor.

FIG. 2 is a schematic plan view illustrating a state where the protective film 18 and the fixed electrode plate 19 are removed from the above acoustic sensor 11, and illustrates the arrangement of the projections 17 provided on the lower surface of the diaphragm 15. (The projections are provided on the lower surface of the diaphragm, and therefore the projections are not seen from the plan view, but are illustrated solid lines for convenience. The same applies hereafter.) FIG. 3(A) is an enlarged plan view of a part of K1 in FIG. 2, and FIG. 3(B) is a sectional view taken along the line K2-K2 of FIG. 3(A). (A structure seen across the section is also illustrated in the sectional view. The same applies hereafter.) The diaphragm 15 extends beam portions 21 in diagonal directions from four corners, and each beam portion 21 is fixed on the anchor (not illustrated) provided on the upper surface of the silicon substrate 12. The diaphragm 15 has a shape almost analogous to the opening 14 except the beam portions 21, and a region to overlap with the upper surface of the silicon substrate 12 (region around the opening 14) in the lower surface of the diaphragm 15 (hereinafter, referred to as the outer edge of the diaphragm 15) has an almost uniform width.

On the lower surface of the outer edge of the diaphragm 15, the projections 17 are almost uniformly distributed. As illustrated in FIG. 3(A), the projections 17 are arranged in a plurality of rows in parallel to the edge 14A of the opening 14. That is, the projections 17 are arranged at proper intervals along a straight line a parallel to the edge 14A (outer periphery) of the opening 14, in each side of the outer edge of the diaphragm 15. In an example illustrated in the drawings, the projections 17 are arranged in three rows.

The action of the projections 17 is to touch the upper surface of the silicon substrate 12 in order to prevent the diaphragm 15 from being brought into contact with and sticking to the upper surface of the silicon substrate 12 when the diaphragm 15 is largely deformed. However, when the arrangement density (number density) of the projections 17 is increased, the total area of contact surfaces between the projections 17 and silicon substrate 12 is increased as illustrated in FIG. 4(A) and FIG. 4(B). (The number of rows of the projections 17 are increased to four rows in FIG. 4(A) and FIG. 4(B).) Therefore, adhesive strength between the projections 17 and the silicon substrate 12 is larger than force for elastically returning the diaphragm 15 upward, thereby causing a defect that the projections 17 themselves stick to the silicon substrate 12.

Thus, the arrangement density (or the number of) of the projections 17 is restricted, and therefore a distance Ledge from the edge 14A of the opening 14 to the projection 17 located closest to the edge 14A is also likely to increases. In a case where this distance Ledge is long, there is a risk that a mute phenomenon occurs. The mute phenomenon is a phenomenon that the acoustic sensor 11 does not pick up sound (i.e., does not detect acoustic vibration). For example, in a microphone module 22 in which a package 23 houses the acoustic sensor 11 and the processing circuit 24 as illustrated in FIG. 6, a case of strongly blowing from a sound introduction hole 26 into the microphone module 22 is considered. The breath blown against the sound introduction hole 26 flows to a package internal space 25 (back chamber) through the chamber 13 (front chamber) of the acoustic sensor 11, and therefore the pressure of the package internal space 25 instantaneously rises right after strongly blowing on the package internal space 25. A dotted patterned part in FIG. 6 indicates a high pressure region. On the other hand, the inside of the chamber 13 of the acoustic sensor 11 rapidly returns to the atmospheric pressure. Therefore, as illustrated in FIGS. 5(A) and 5(B), the diaphragm 15 is strongly pressed toward the substrate by the pressure of the package internal space 25, to close the opening 14 of the chamber 13, so that sound is not picked up until the package internal space 25 returns to the atmospheric pressure. Thus, the mute phenomenon occurs.

In the vicinity of the opening 14, when the diaphragm 15 is regarded as a cantilever supported by the projections 17 located on the end, the displacement of the cantilever (displacement of the diaphragm 15 at the edge 14A of the opening 14) is proportional to Ledge$^3$. Accordingly, in order that the mute phenomenon is unlikely to occur, the distance Ledge from the edge 14A of the opening 14 to each projection 17 located nearest to the edge 14A needs to reduce as short as possible. In order to shorten the distance Ledge, as illustrated in FIG. 7(A), the whole of the projections 17 is simply moved in parallel toward the edge of the opening 14. However, in this method, a distance Louter from the edge 15A of the diaphragm 15 to each projection 17 located nearest to the edge 15A increases, and therefore the vicinity of the edge 15A of the diaphragm 15 is likely to stick to the silicon substrate 12, as illustrated in FIG. 7(B).

In order to prevent the mute phenomenon or the sticking in the vicinity of the edge 15A of the diaphragm 15, it is considered that the projections 17 located in a row close to the edge 14A of the opening 14 are moved in parallel toward the edge of the opening 14, and the projections 17 located in a row close to the edge 15A of the diaphragm 15 are moved in parallel toward the edge of the diaphragm 15, as illustrated in FIG. 8(A). However, in this case, intervals Lint between the projections 17 are widened, and therefore a risk that parts located between the rows of the projections 17 are bent to stick to the upper surface of the silicon substrate 12 increases as illustrated in FIG. 8(B).

It is considered that the width W of the outer edge of the diaphragm 15 (length of the vent hole 16) is shortened without changing the intervals between the rows of the projections 17. When the width W of the outer edge of the diaphragm 15 is shortened, both the distances Ledge and Louter can be reduced. However, in this case, the width W of the diaphragm 15 (length of the vent hole 16) is shortened, and therefore acoustic resistance in the vent hole 16 is reduced, sensitivity in low-pitched sound range is lowered, and the frequency characteristic of the acoustic sensor is lowered.

As another method of preventing the mute phenomenon, it is considered that the heights of the projections 17 are increased, as illustrated in FIG. 9(A). In order to close the opening 14 by the diaphragm 15, deformation equivalent to at least the heights of the projections 17 is required. Therefore, the higher the projections 17 become, the less frequently the mute phenomenon occurs. However, when the heights of the projections 17 are increased, a distance d between the lower surface of each projection 17 and the upper surface of the silicon substrate 12 is shortened, and therefore the projections 17 are likely to stick to the silicon substrate 12.

Furthermore, as illustrated in FIG. 9(B), in a case where the heights of the projections 17 are increased, and the distance between the lower surface of each projection 17 and the upper surface of the silicon substrate 12 is increased, a distance H between the lower surface of the diaphragm 15 and the upper surface of the silicon substrate 12 (height of the vent hole 16) is increased. This causes a defect that acoustic resistance in the vent hole 16 is reduced, sensitivity in low-pitched sound range is lowered, and the frequency characteristic of the acoustic sensor is lowered.

The projections 17 are uniformly arranged at the outer edge of the diaphragm 15. This is because when the arrangement of the projections 17 is nonuniform and density is uneven, the sticking to the substrate as described above is likely to occur. On the other hand, according to one or more embodiments of the present invention, from the point of view of noise design, the width W of the outer edge of the diaphragm 15 is constant. Accordingly, the diaphragm 15 needs to have a shape almost analogous to the opening 14. For example, according to one or more embodiments of the present invention, in a case where the opening 14 is circular, the diaphragm 15 is circular, as illustrated in FIG. 10(A).

FIG. 10(A) illustrates a conventional acoustic sensor in which a circular diaphragm 15 is provided on a silicon substrate 12 having a circular opening 14 of a chamber. Additionally, FIG. 10(B) is an enlarged plan view of a part of K3 in FIG. 10(A). Such a conventional example, the projections 17 are provided along arcs b (concentric circles) parallel to the edge 14A of the opening 14 and the edge 15A of the diaphragm 15. In order to make the arrangement density of the projections 17 uniform over the whole outer edge of the diaphragm 15, the projections 17 are generally provided along the arcs b (concentric circular) parallel to the edge 14A of the opening 14, as illustrated in FIG. 10(A) and FIG. 10(B).

Patent Document 1: International Publication No. 2002/015636 (WO2002/015636A)

SUMMARY

One or more embodiments of the present invention provides an acoustic transducer, in which a mute phenomenon is unlikely to occur, and a vibration electrode plate (diaphragm) is unlikely to stick to a substrate.

An acoustic transducer according to one or more embodiments of the present invention is a capacitance type acoustic transducer including: a substrate having an opening in an upper surface; a vibration electrode plate disposed above the substrate, and having an outer edge facing the upper surface of the substrate with a gap therebetween, the vibration electrode plate configured to cover an upper side of the opening; a fixed electrode plate facing the vibration electrode plate; and a plurality of projections protruding on a lower surface of the outer edge of the vibration electrode plate, the plurality of projections being not arranged along a straight line or a curved line parallel to an edge of the opening in at least a part of one or at least two arrays formed on the lower surface of the outer edge. Herein, the array configured from the projections refers to a group of projections continuously connected with the shortest segment, when the projections located at the shortest distance are sequentially connected with the segment. Additionally, the projections that configure the array are not arranged along the straight line or the curved line parallel to the edge of the opening, which refers that a distance from the edge of the opening to one of the projections, which is measured in a direction orthogonal to the edge of the opening, as viewed from a direction perpendicular to the surface of the vibration electrode plate, is different from a distance from the edge of the opening to another projection. On the contrary, the projections that configure the array are arranged along the straight line or the curved line parallel to the edge of the opening, which refers that respective distances from the edge of the opening to all the projections, which are measured in a direction orthogonal to the edge of the opening, as viewed from a direction perpendicular to the surface of the vibration electrode plate, are the same.

In an acoustic transducer according to one or more embodiments of the present invention, the projections that configures at least a part of the one or at least two arrays are not arranged along the straight line or the curved line parallel to the edge of the opening. That is, in the array in which the projections are not arranged along the straight line or the curved line parallel to the edge of the opening, distances measured from the edge of the opening to the respective projections are not constant. Accordingly, it is possible to shorten the distance from the edge of the opening to the projection located nearest to the edge of the opening, or the distance from the edge of the vibration electrode plate to the projection located nearest to the edge of the vibration electrode plate, without increasing the number of the projections or the density of the projections. Accordingly, it is possible to suppress the occurrence of a mute phenomenon, and to prevent the sticking of the edge of the vibration electrode plate. Furthermore, according to such a structure, the acoustic resistance of the acoustic transducer is not lowered.

As described above, the array configured from the projections refers to a group of projections continuously connected with the shortest segment, when the projections located at the shortest distance are sequentially connected with the segment. Accordingly, at least one of adjacent two projections of the projections in the same array is a projection located at the shortest distance among all the projections provided on the vibration electrode plate as viewed from the other of the adjacent two projections.

In an acoustic transducer according to one or more embodiments of the present invention, in the array in which the projections are not arranged along the straight line or the curved line parallel to the edge of the opening, the one or at least two projections are present between the projection located nearest to the edge of the opening and the projection located farthest from the edge of the opening. According to one or more embodiments of the present invention, it is possible to prevent the projections from separating into two rows, and to prevent an interval between the projections from increasing. As a result, the vibration electrode plate is unlikely to stick to the substrate between the projections.

In an acoustic transducer according to one or more embodiments of the present invention, a projection protrudes also in a region, facing the opening, of a lower surface of the vibration electrode plate. According to one or more embodiments of the present invention, it is possible to prevent a mute phenomenon from easily occurring due to variation in processes of opening the substrate.

In an acoustic transducer according to one or more embodiments of the present invention, the plurality of arrays configured from the projections are formed, the projections that configure an array located nearest to the edge of the opening are not arranged along the straight line or the curved line parallel to the edge of the opening, and the projections that configure an array other than the array located nearest to the edge of the opening are arranged along the straight line or the curved line parallel to the edge of the opening. According to one or more embodiments of the present invention, the distance from the edge of the opening to the projection located nearest to the edge of the opening can be shortened, a mute phenomenon is unlikely to occur. One or more embodiments of the present invention includes a plurality of arrays or all arrays are nonparallel to the edge of the opening.

In an acoustic transducer according to one or more embodiments of the present invention, in the array in which the projections are not arranged along the straight line or the curved line parallel to the edge of the opening, a part of the projections is not arranged along the straight line or the curved line parallel to the edge of the opening, and the remaining projections are arranged along the straight line or the curved line parallel to the edge of the opening. According to one or more embodiments of the present invention, a part of the arrays may be nonparallel to the edge of the opening.

According to one or more embodiments of the present invention, the distance between the edge of the opening and the edge of the vibration electrode plate is constant along the edge of the opening. In this case, the width of the outer edge of the vibration electrode plate is uniform, and the diaphragm is unlikely to stick to the substrate.

An example of the array in which the projections are not arranged along the straight line or the curved line parallel to the edge of the opening includes an array in which the projections are meanderingly arranged in a zigzag manner. Additionally, there is a case where the projections are arranged along a straight line extending in a direction inclined to the edge of the opening.

In a case where the opening of the substrate is formed in a rectangular shape or a polygonal shape, there is a case where, in at least a part of the array, the projections are not arranged along a straight line parallel to each of sides of the rectangular shape or the polygonal shape that is the edge of the opening. Similarly, in a case where the opening of the substrate is formed in a circular shape, there is a case where, in at least a part of the arrays, the projections are not arranged along an arc parallel to a circumference of the circular shape that is the edge of the opening.

An acoustic transducer according to one or more embodiments of the present invention is a capacitance type acoustic transducer including: a substrate having an opening in a surface; a vibration electrode plate disposed on a surface of the substrate and configured to cover the opening; and a fixed electrode plate facing the vibration electrode plate. An outer edge of the vibration electrode plate faces the surface of the substrate with a gap therebetween, a plurality of projections protrude in a region, facing the outer edge of the vibration electrode film, of the surface of the substrate, and one or at least two arrays configured from the projections are formed on the surface of the substrate, and in at least a part of the arrays, the projections are not arranged along a straight line or a curved line parallel to an edge of the opening. Also in the acoustic transducer according to one or more embodiments of the present invention, the array configured from the projections refers to a group of projections continuously connected with the shortest segment, when the projections located at the shortest distance are sequentially connected with the segment. Additionally, the projections that configure the array are not arranged along the straight line or the curved line parallel to the edge of the opening, which refers that a distance from the edge of the opening to one of the projections, which are measured in a direction orthogonal to the edge of the opening, as viewed from a direction perpendicular to the surface of the vibration electrode plate, is different from a distance from the edge of the opening to another projection. On the contrary, the projections that configure the array are arranged along the straight line or the curved line parallel to the edge of the opening, which refers that respective distances from the edge of the opening to all the projections, which are measured in a direction orthogonal to the edge of the opening, as viewed from a direction perpendicular to the surface of the vibration electrode plate, are the same.

In the acoustic transducer according to one or more embodiments of the present invention, the projections that configure at least a part of the one or at least two arrays are not arranged along the straight line or the curved line parallel to the edge of the opening. That is, in the array in which the projections are not arranged along the straight line or the curved line parallel to the edge of the opening, distances measured from the edge of the opening to the respective projections are not constant. Accordingly, it is possible to shorten the distance from the edge of the opening to the projection located nearest to the edge of the opening, or the distance from the edge of the vibration electrode plate to the projection located nearest to the edge of the vibration electrode plate, without increasing the number of the projections or the density of the projections. Accordingly, it is possible to suppress the occurrence of a mute phenomenon, and to prevent the sticking of the edge of the vibration electrode plate. Furthermore, according to such a structure, the acoustic resistance of the acoustic transducer is not lowered.

As described above, the array configured from the projections refers to a group of projections continuously connected with the shortest segment, when the projections located at the shortest distance are sequentially connected with the segment. Accordingly, at least one of adjacent two projections of the projections in the same array is a projection located at the shortest distance among all the projections provided on the surface of the substrate as viewed from the other of the adjacent two projections.

The acoustic transducer according to embodiments of the present invention may be different from each other, in that the projections are provided on the outer edge lower surface of the vibration electrode plate, or on the surface of the substrate, in the region where the outer edge of the vibration electrode plate faces the surface of the substrate.

The present invention includes various combination of the components described above, and the present invention enables a large number of variations in the combination of the components.

BRIEF DESCRIPTION OF THE DRAWINGS

FIG. 4(B) is a sectional view illustrating a state where the diaphragm is pressed against the edge of the opening.

FIG. 10(A) is a plan view illustrating a circular diaphragm provided on a circular opening, and FIG. 10(B) is an enlarged plan view of a part of K3 in FIG. 10(A).

DETAILED DESCRIPTION

Hereinafter, embodiments of the present invention will be described with reference to the attached drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. Although the following description will be made, taking an example of an acoustic sensor, the present invention is not limited to the acoustic sensor, but is applicable to a speaker or the like manufactured by utilizing a MEMS technology. Additionally, the present invention should not be limited to the following embodiments, but various design changes can be made without departing from the scope of the present invention.

Embodiment 1

Figure 11:
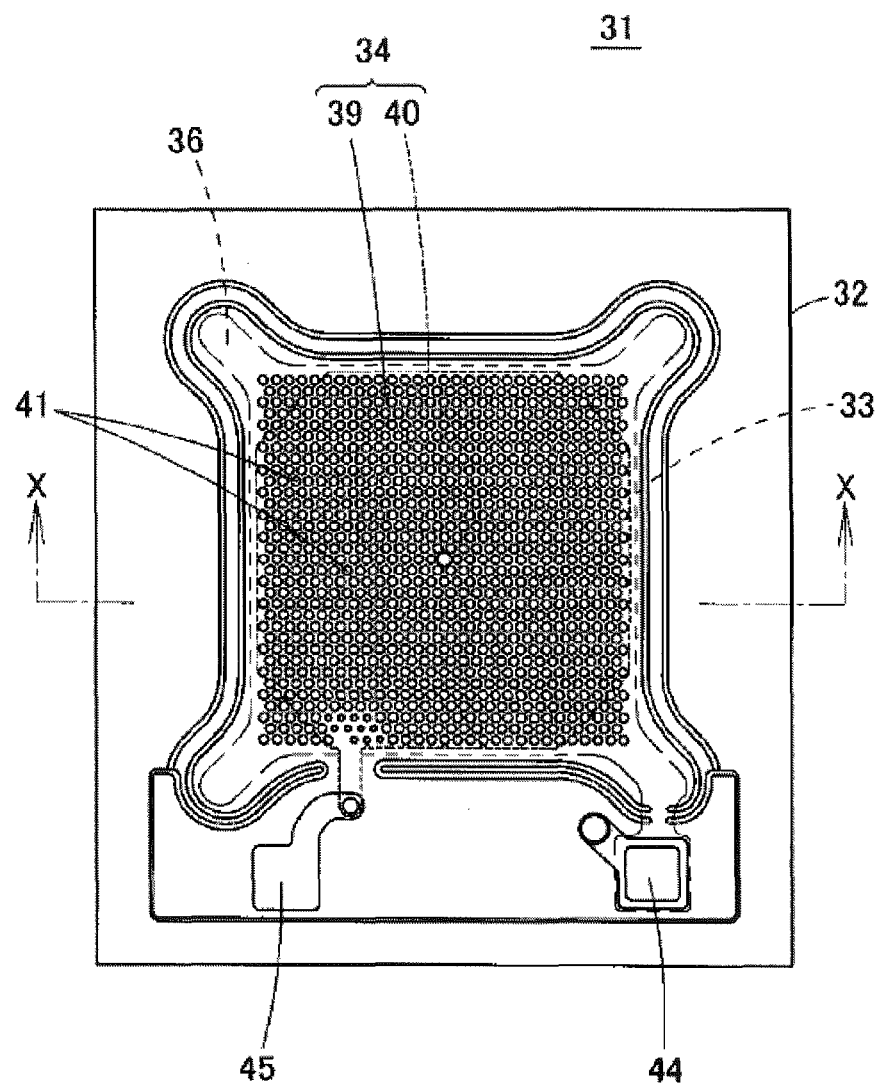
FIG. 11 is a plan view illustrating an acoustic sensor according to Embodiment 1 of the present invention.
Figure 12:
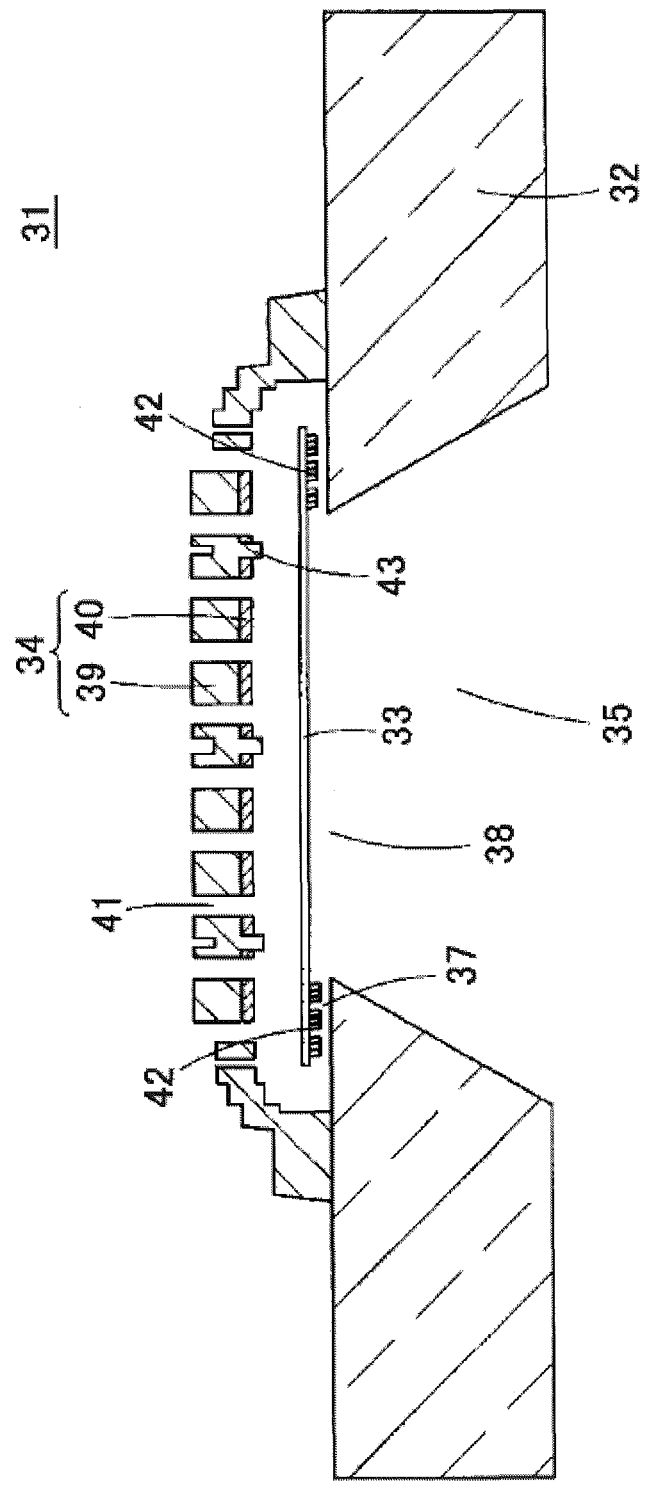
FIG. 12 is a sectional view taken along the line X-X of FIG. 11.
Figure 13:
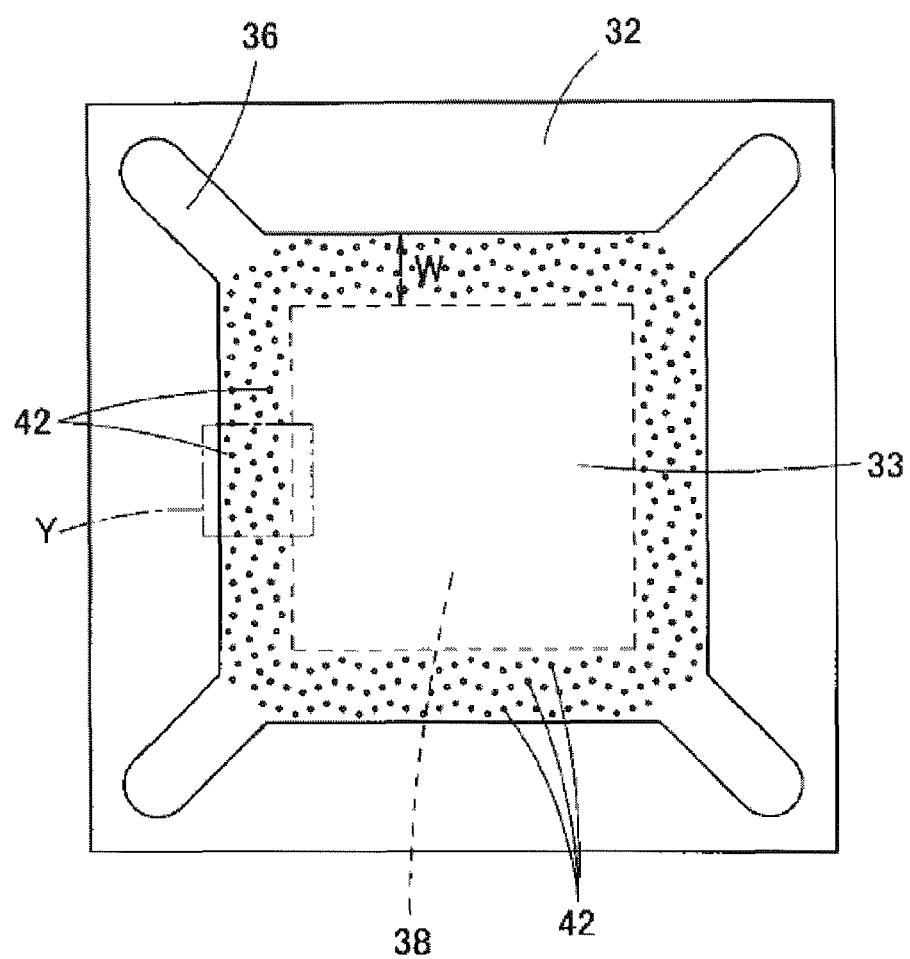
FIG. 13 is a plan view illustrating a diaphragm arranged on the upper surface of a silicon substrate, in the acoustic sensor of Embodiment 1.

A structure of an acoustic sensor 31 according to Embodiment 1 of the present invention will be described with reference to FIG. 11 and FIG. 12. FIG. 11 is a plan view illustrating the acoustic sensor 31 according to Embodiment 1 of the present invention. FIG. 12 is a sectional view taken along the line X-X of FIG. 11. FIG. 13 is a plan view representing the shape of a diaphragm 33 formed on the upper surface of a silicon substrate 32, and represents the arrangement of projections 42 provided on the lower surface of the diaphragm 33.

This acoustic sensor 31 is a capacitance type sensor that is manufactured by utilizing a MEMS technology. In the acoustic sensor 31, as illustrated in FIG. 12, a vibration electrode plate, namely the diaphragm 33 is formed on the upper surface of the silicon substrate 32 (substrate), and a back plate 34 is provided above the diaphragm 33 with a minute air gap (gap) therebetween.

A silicon substrate 32 formed of single-crystal silicon is formed with a chamber 35 (hollow) that penetrates from the upper surface to the lower surface. This chamber 35 becomes a back chamber or a front chamber depending on the usage form of the acoustic sensor 31. A wall surface of the chamber 35 may be a vertical surface or a tapered inclined surface. The chamber 35 is vertically open, and an opening 38 is rectangularly open at the upper surface of the silicon substrate 32.

The diaphragm 33 is formed by a polysilicon thin film having conductivity. The diaphragm 33 has a shape almost analogous to the opening 38 of the chamber 35, and is formed in a substantially rectangle as illustrated in FIG. 13. Respective beam portions 36 horizontally extend in the diagonal directions from the corners of the diaphragm 33. The diaphragm 33 is arranged on the upper surface of the silicon substrate 32 so as to cover the opening 38 of the chamber 35, and an anchor (not illustrated) supports the lower surfaces of the beam portions 36. Accordingly, the diaphragm 33 is arranged on the upper surface of the silicon substrate 32 while being slightly floated from the upper surface of the silicon substrate 32.

The outer edge of the diaphragm 33 overlaps with a region surrounding the opening 38 in the silicon substrate upper surface. In this specification, a region, facing the silicon substrate upper surface (region surrounding the opening 38), of the diaphragm 33 is referred to as the outer edge of the diaphragm 33. As illustrated in FIG. 13, the widths W of respective sides of the outer edge of the diaphragm 33 are uniform, and are equal.

A narrow gap in a height direction for allowing acoustic vibration or air to pass, namely a vent hole 37 is formed between the outer edge lower surface of the diaphragm 33 and the upper surface of the silicon substrate 32. The vent hole 37 is formed along the lower surface of the outer edge of the diaphragm 33 between the beam portion 36 and the beam portion 36. The vent hole 37 below the outer edge of the diaphragm 33 is short in a width direction (direction orthogonal to the edge 38A of the opening 38) and long in a length direction (direction parallel to the edge 38A of the opening 38).

As illustrated in FIG. 12, the plurality of projections 42 protrude on the lower surface of the outer edge of the diaphragm 33 to prevent the sticking of the diaphragm 33 or the like. The projections 42 are distributed with such density that the projections 42 themselves do not stick to the upper surface of the silicon substrate 32, and with almost uniform density.

The back plate 34 is a plate obtained by providing a fixed electrode plate 40 made of polysilicon on the lower surface of a protective film 39 made of SiN. As illustrated in FIG. 11 and FIG. 12, the protective film 39 is formed in a substantially rectangular dome shape. A hollow part is present below the protective film 39, and covers the diaphragm 33. The fixed electrode plate 40 is provided so as to face the diaphragm 33.

A minute air gap (gap) is formed between the lower surface of the back plate 34 (i.e., lower surface of the fixed electrode plate 40) and the upper surface of the diaphragm 33. The fixed electrode plate 40 and the diaphragm 33 face each other, and configure a capacitor for detecting acoustic vibration to convert the acoustic vibration into an electric signal.

A large number of acoustic holes 41 (acoustic perforations) for allowing acoustic vibration to pass are formed in the almost whole of the back plate 34 so as to penetrate from the upper surface to the lower surface. As illustrated in FIG. 11, the acoustic holes 41 are regularly arrayed. The acoustic holes 41 are arrayed in a triangular shape along three directions each forming an angle of 120° in the illustrated example, but may be arranged in a rectangular shape or a concentric circular shape.

As illustrated in FIG. 12, cylindrical minute stoppers 43 protrude on the lower surface of the back plate 34. The stoppers 43 are provided in order to prevent the diaphragm 33 from sticking (fixing) to the back plate 34, and integrally protrude from the lower surface of the protective film 39 to the lower surface of the back plate 34 through the fixed electrode plate 40. The stoppers 43 are made of SiN similarly to the protective film 39, and therefore have insulating properties.

As illustrated in FIG. 11, an electrode pad 44 that is electrically connected to the diaphragm 33 and an electrode pad 45 that is electrically connected to the fixed electrode plate 40 are provided on the upper surface of the acoustic sensor 31.

In the acoustic sensor 31, when acoustic vibration passes acoustic holes 41 to enter the air gap formed between the back plate 34 and the diaphragm 33, the diaphragm 33 that is a thin film vibrates by the acoustic vibration. When the diaphragm 33 vibrates to change a gap distance between the diaphragm 33 and the fixed electrode plate 40, an electrostatic capacity between the diaphragm 33 and the fixed electrode plate 40 changes. As a result, in this acoustic sensor 31, acoustic vibration (change of sound pressure) detected by the diaphragm 33 becomes the change of the electrostatic capacity between the diaphragm 33 and the fixed electrode plate 40, and is outputted as an electric signal.

Figure 14A:
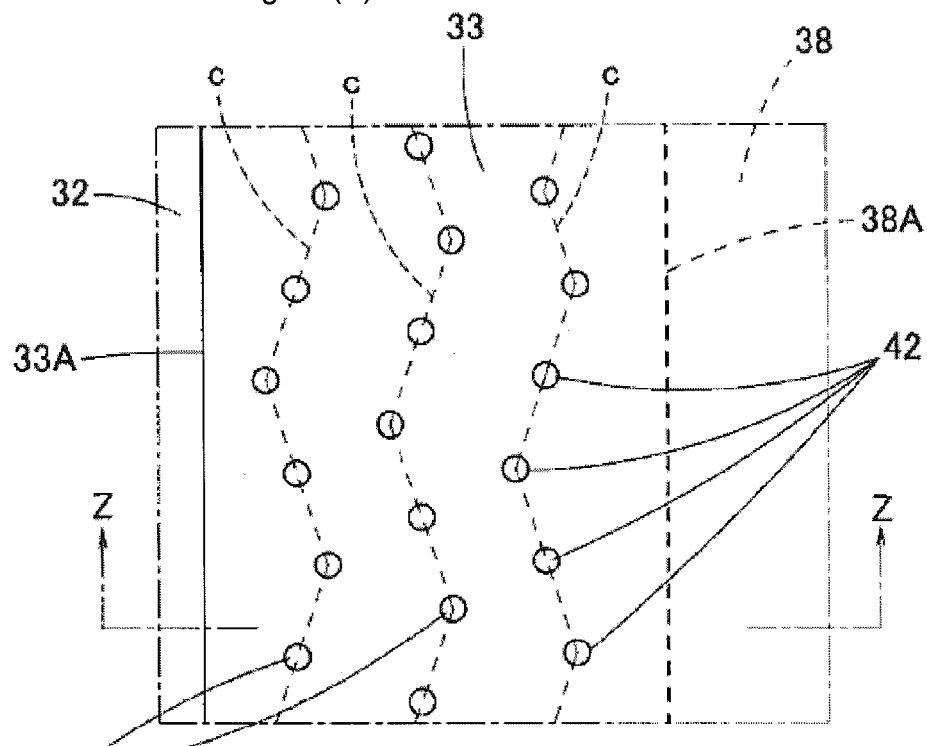
FIG. 14(A) is an enlarged plan view illustrating a part of Y in FIG. 13.
Figure 14B:
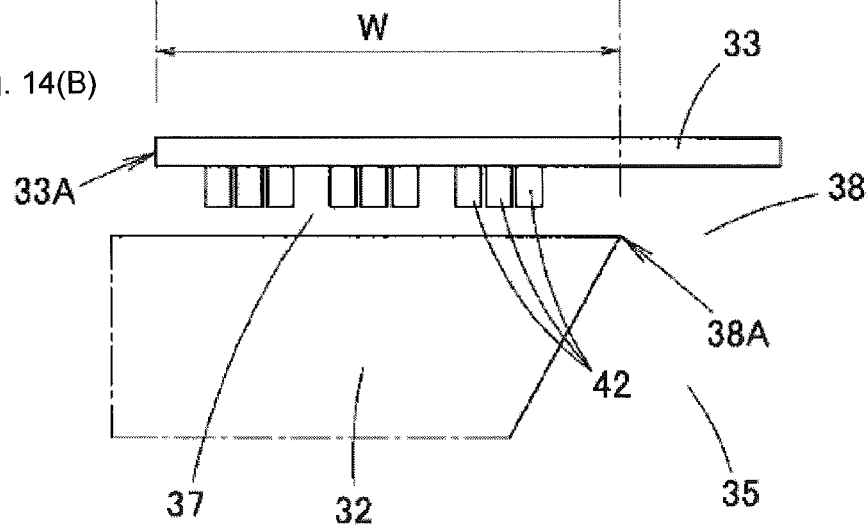
FIG. 14(B) is a sectional view taken along the line Z-Z of FIG. 14(A).

Now, the arrangement of the projections 42 provided on the lower surface of the outer edge of the diaphragm 33 will be described. FIG. 14(A) is an enlarged plan view illustrating a part of Y in FIG. 13. FIG. 14(B) is a sectional view taken along the line Z-Z of FIG. 14(A). The width W of the outer edge of the diaphragm 33 is uniform, and the projections 42 are almost uniformly distributed on the lower surface of the outer edge of the diaphragm 33. As illustrated in FIG. 14(A), the projections 42 form a plurality of arrays. Herein, the array of the projections 42 refers that a projection 42 located at the shortest distance as viewed from a certain projection 42 is virtually connected to the certain projection 42 with a segment, and furthermore, a projection 42 located at the shortest distance is sequentially connected with a segment. In other words, the array of the projections 42 is the collection of the projections 42 having strong continuity in arrangement. In the illustrated example, three arrays are formed on each side of the diaphragm 33.

Figure 1:
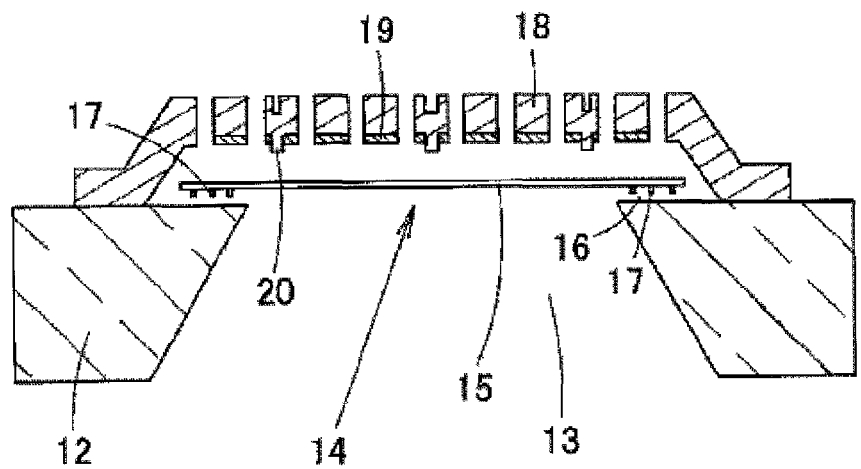
FIG. 1 is a schematic sectional view illustrating a conventional general acoustic sensor.
Figure 2:
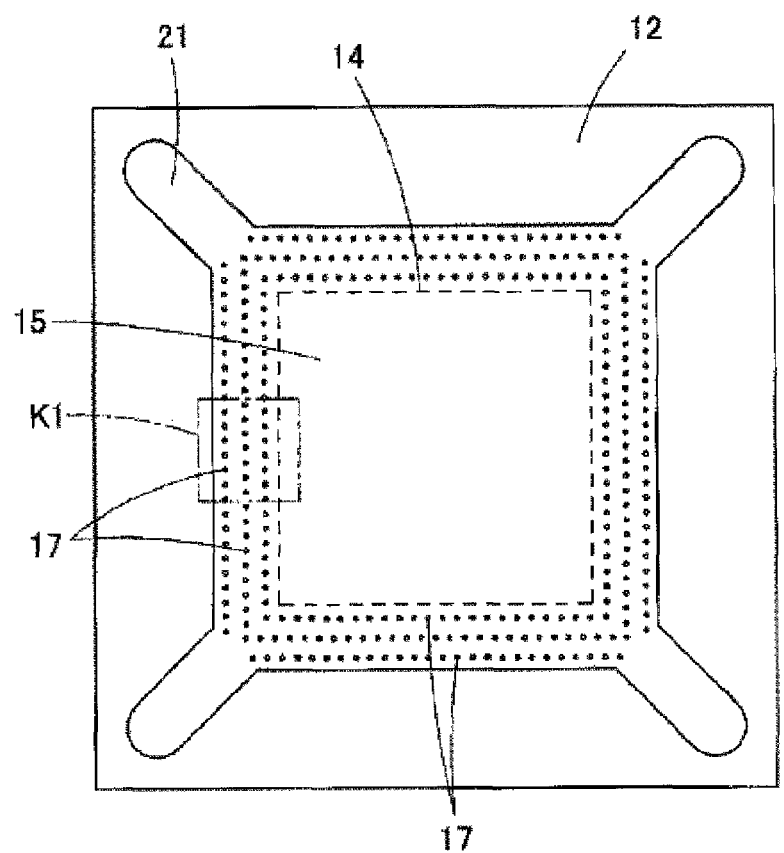
FIG. 2 is a schematic plan view illustrating a state where a protective film and a fixed electrode plate are removed from the above acoustic sensor in FIG. 1.
Figure 3A:
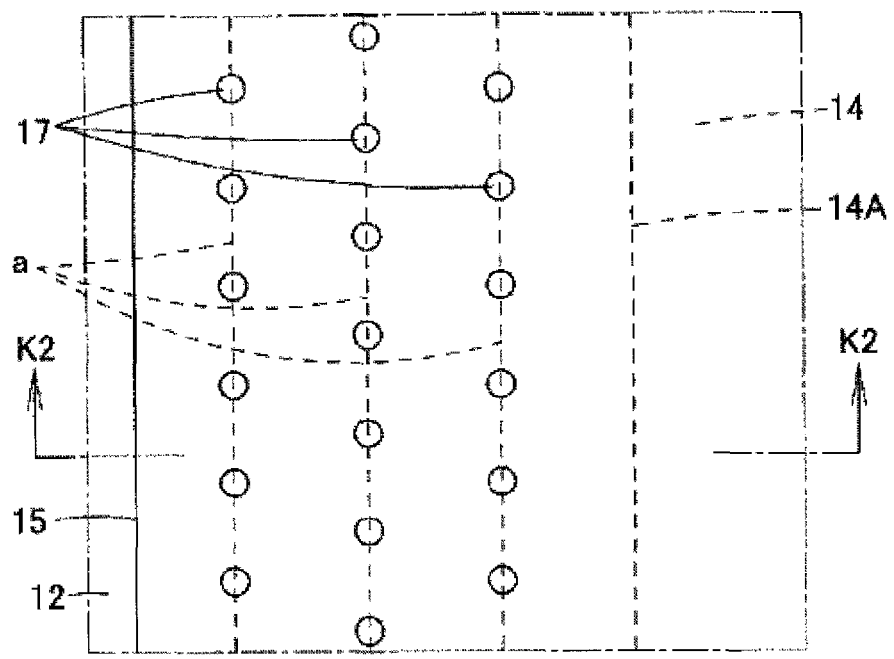
FIG. 3(A) is an enlarged plan view of a part of K1 in FIG. 2.
Figure 3B:
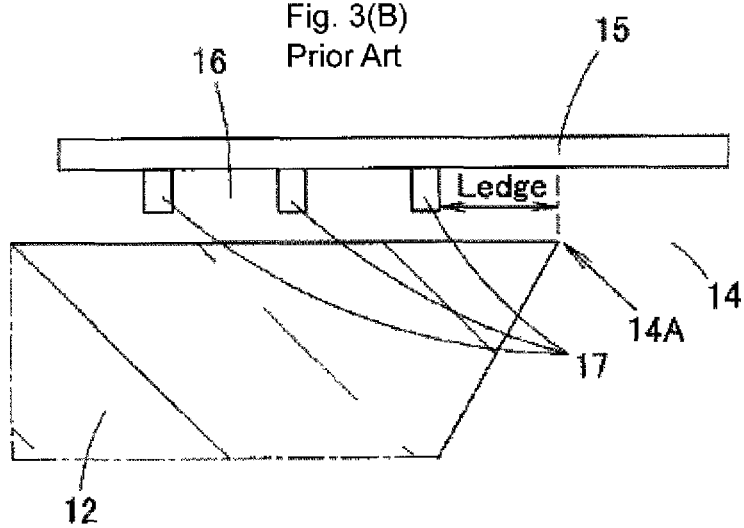
FIG. 3(B) is a sectional view taken along the line K2-K2 of FIG. 3(A).
Figure 4A:
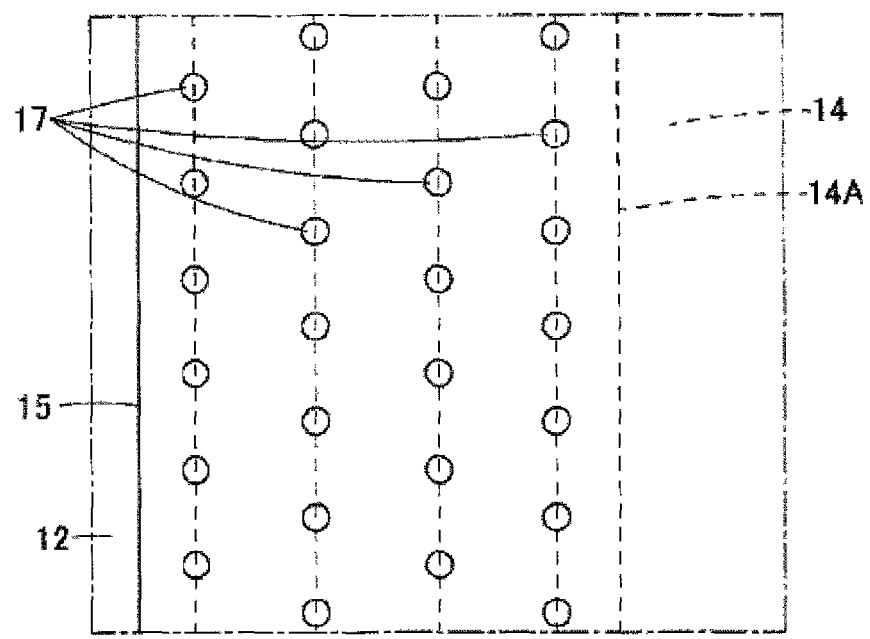
FIG. 4(A) is a plan view illustrating a state where the arrangement density of projections is increased.
Figure 4B:
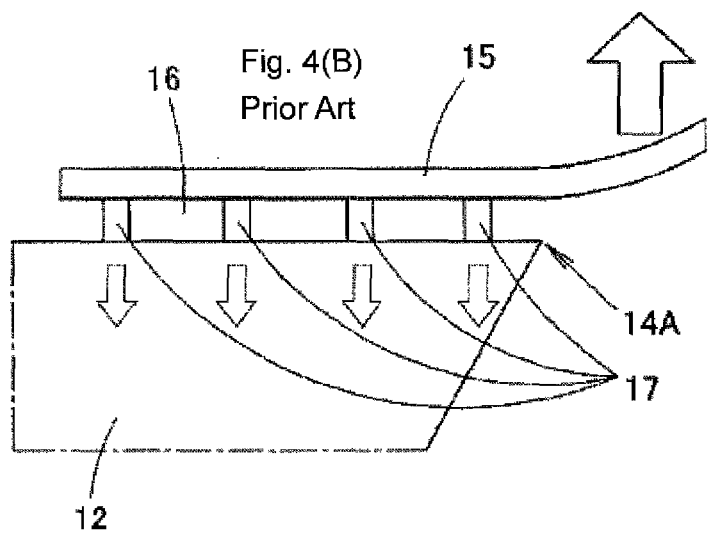
FIG. 4(B) is a sectional view of FIG. 4(A).
Figure 5A:
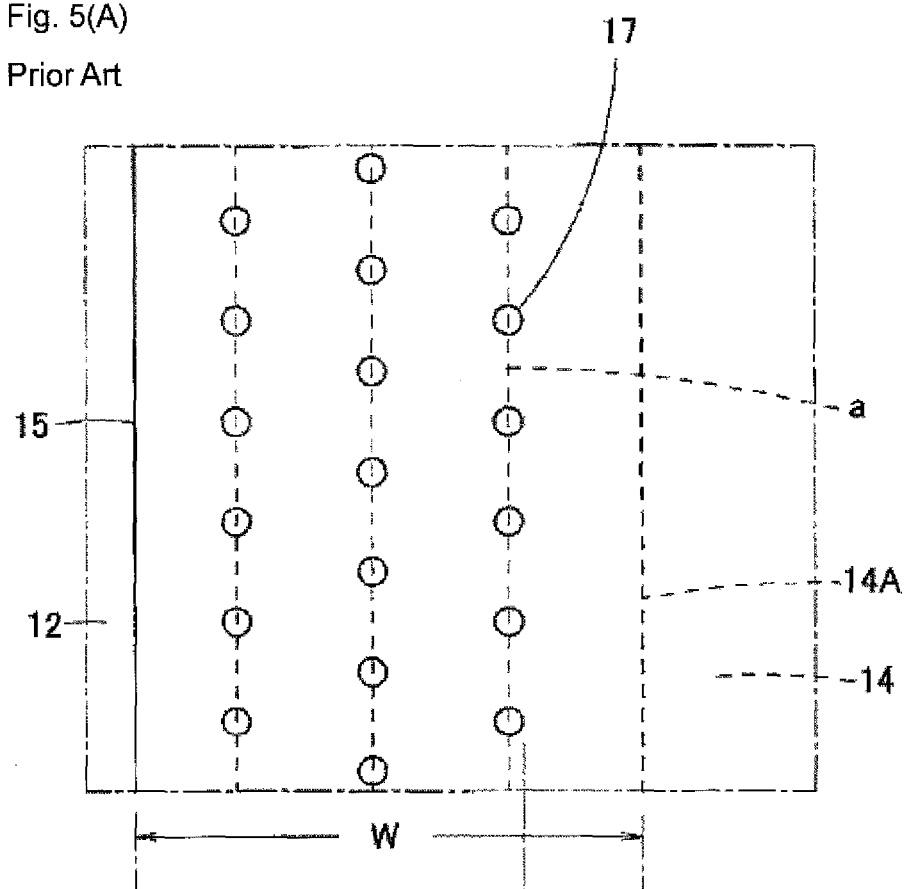
FIG. 5(A) is a plan view illustrating a state where a distance between the edge of an opening and each projection is relatively large.
Figure 5B:
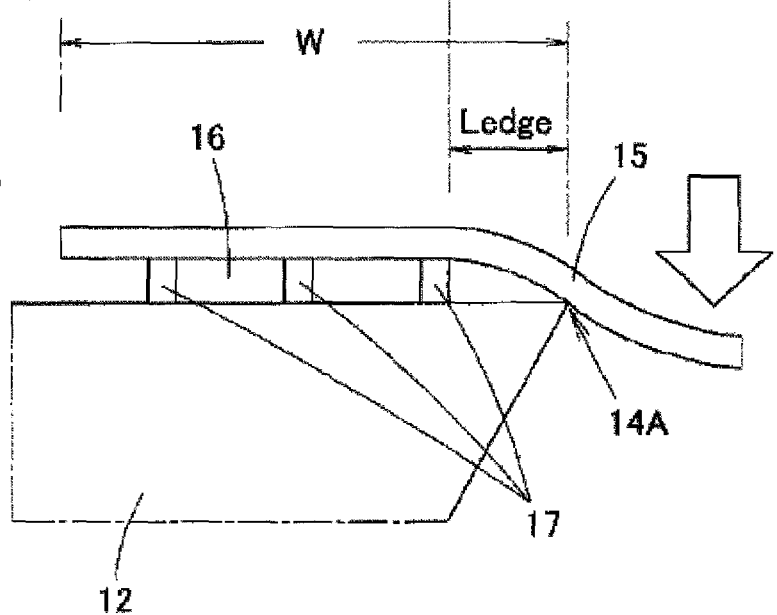
Figure 6A:
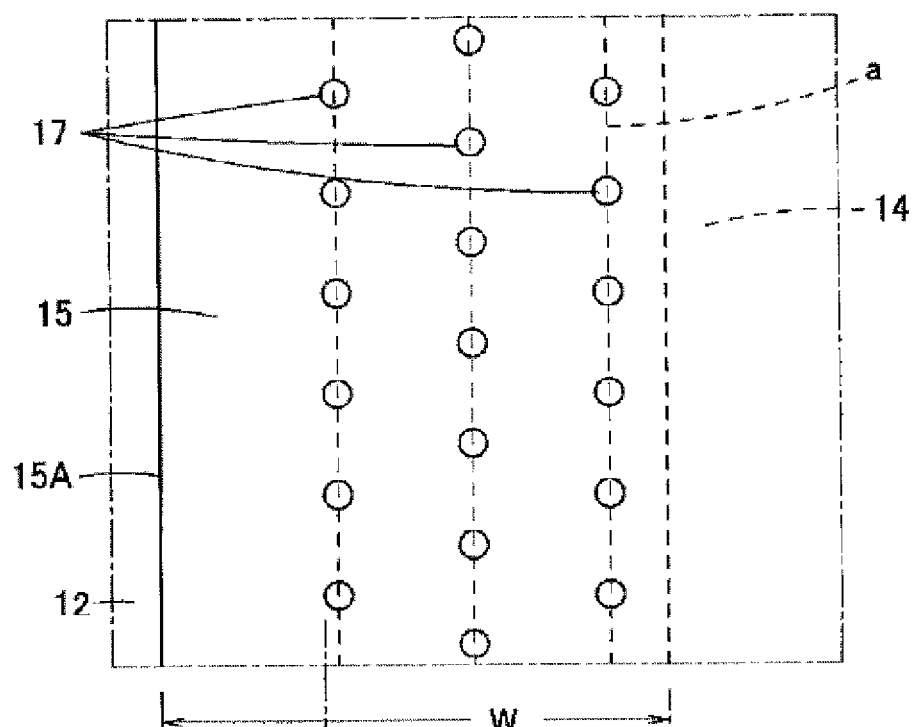
FIG. 6 is a view for illustrating a reason why a situation illustrated in FIG. 4(B) is caused.
Figure 6B:
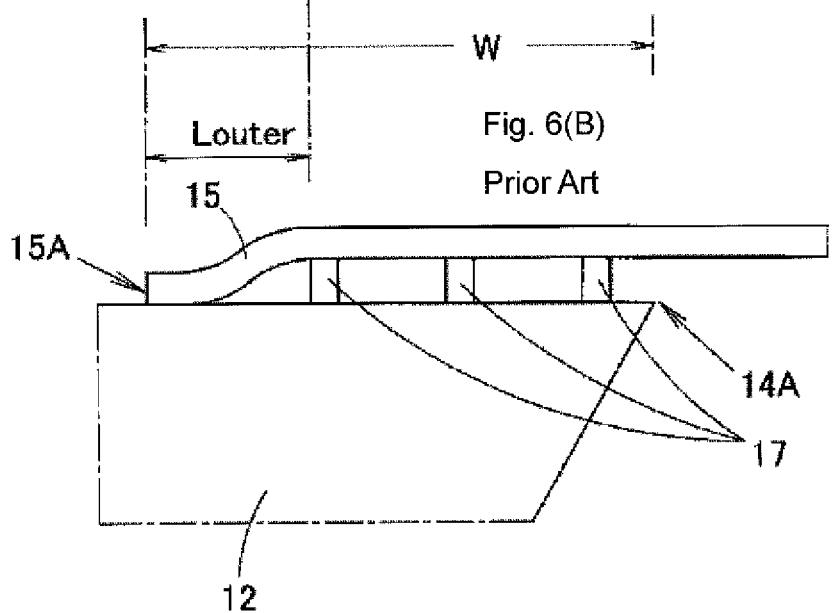
Figure 7A:
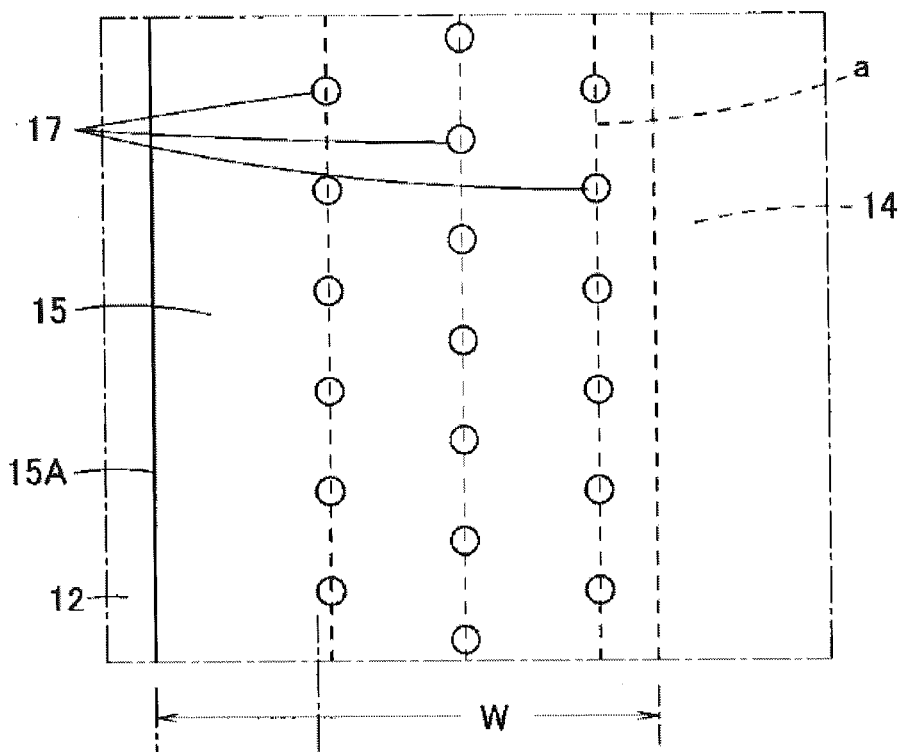
FIG. 7(A) is a plan view illustrating a state where the distance between the edge of the opening and each projection is shortened.
Figure 7B:
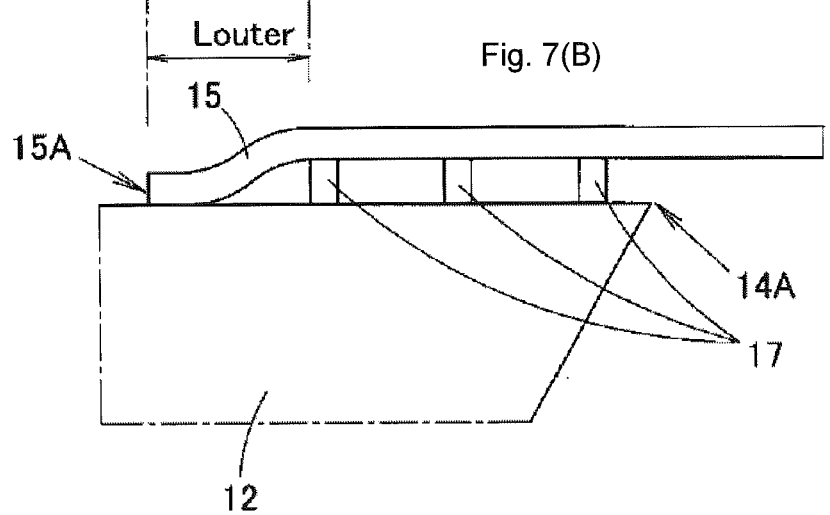
FIG. 7(B) is a sectional view illustrating a state where the vicinity of the edge of the diaphragm sticks to the upper surface of a silicon substrate.
Figure 8A:
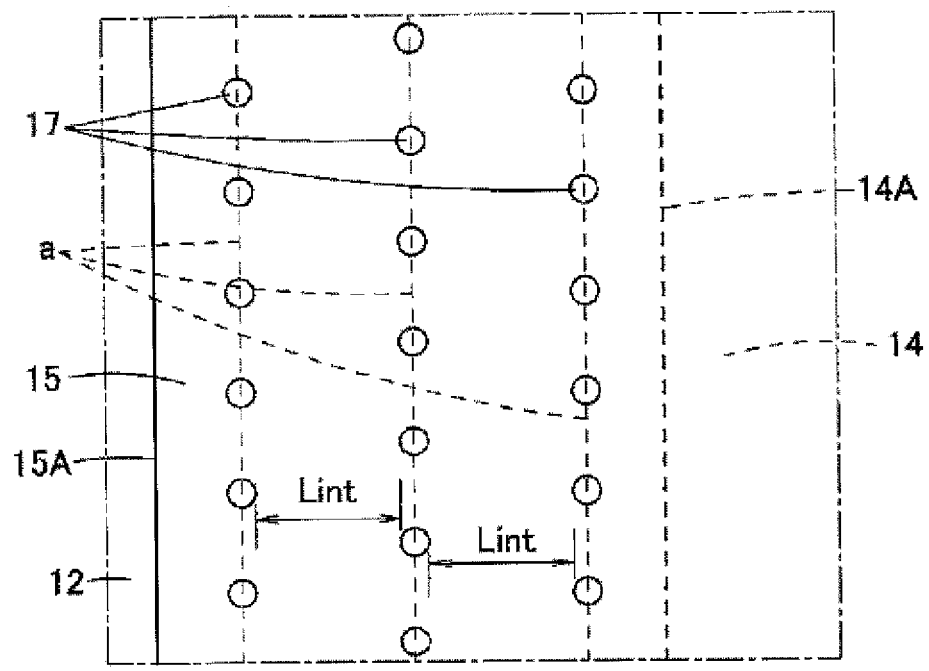
FIG. 8(A) is a plan view illustrating a state where intervals of rows of the arranged projections are widened.
Figure 8B:
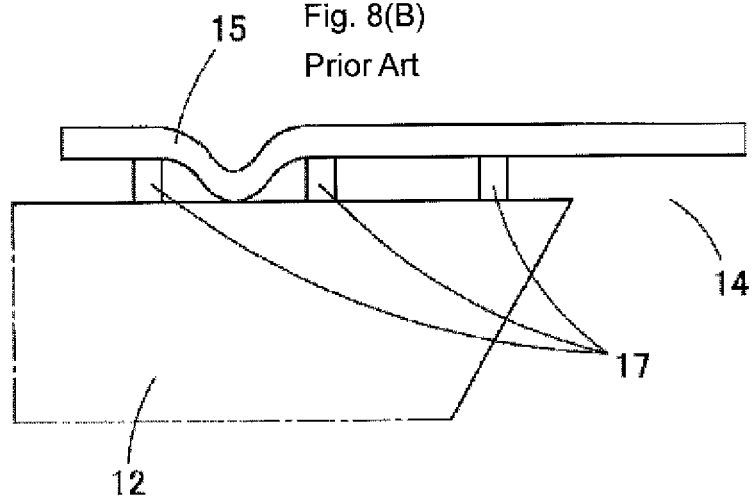
FIG. 8(B) is a sectional view illustrating a state where the diaphragm sticks to the upper surface of the silicon substrate between the projections.
Figure 9A:
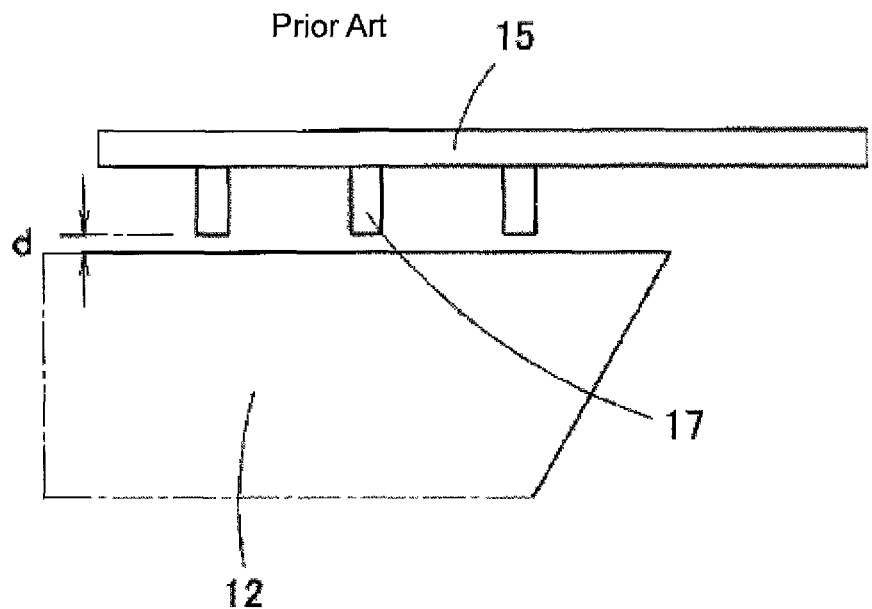
FIG. 9(A) is a sectional view illustrating a state where heights of the projections are increased.
Figure 9B:
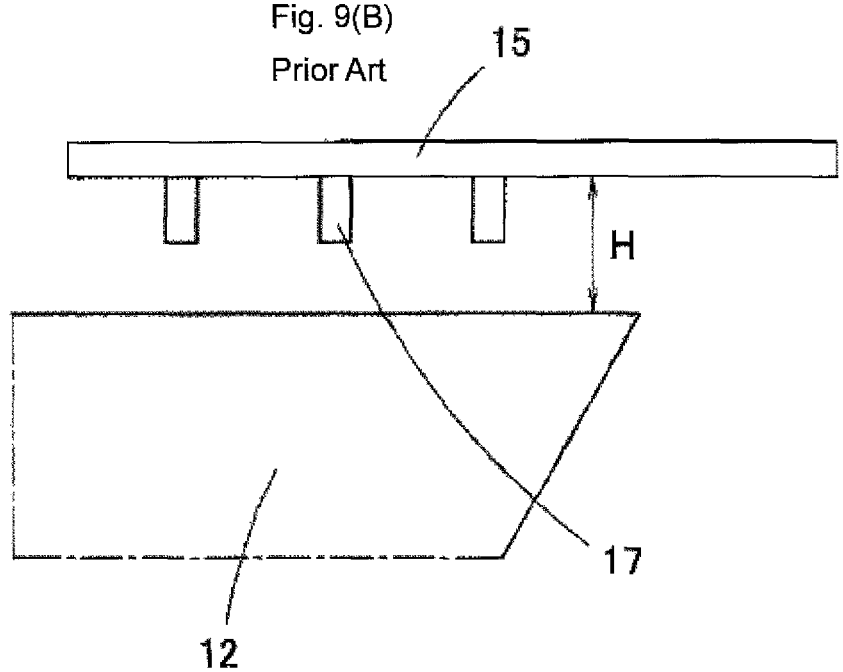
FIG. 9(B) is a sectional view illustrating a state where the heights of the projections are increased, and the distance between the lower surface of each projection and the upper surface of the silicon substrate is increased.

In Embodiment 1, as illustrated in FIG. 14(A), in any array, the projections 42 are arranged on the zigzag line c. This is a line formed by alternately shifting the positions of every second projections 42 in a direction approaching the edge 38A of the opening 38 and in a direction apart from the edge 38A of the opening 38 in each array on the straight line a, on the basis of the array of the projections as illustrated in FIG. 3(A). In the arrays of FIG. 3(A), all the projections are located on the straight line a parallel to the edge 14A of the opening 14. On the contrary, in the arrays of Embodiment 1, each array is parallel to the edge 38A of the opening 38 on average, but the projections 42 are not arranged on a straight line parallel to the edge 38A of the opening 38.

The individual projections 42 are not arranged on the straight line parallel to the edge 38A of the opening 38, which refers that when a distance from the edge 38A of the opening 38 to each projection 42 is measured, a distance from the edge 38A of the opening 38 to at least one of the projections 42 is different from the measured distance from the edge 38A of the opening 38 to another projection 42. On the contrary, the individual projections 42 are arranged on the straight line (or a curved line) parallel to the edge of the opening, which refers that when a distance from the edge of the opening to each projection is measured, distances from the edge of the opening to all the projections are the same. Additionally, in the zigzag arrays of the projections 42 illustrated in FIG. 14(A), the projections 42 are also present between the projections 42 located nearest to the edge 38A of the opening 38 and the projections 42 located farthest from the edge 38A of the opening 38.

Figure 15:
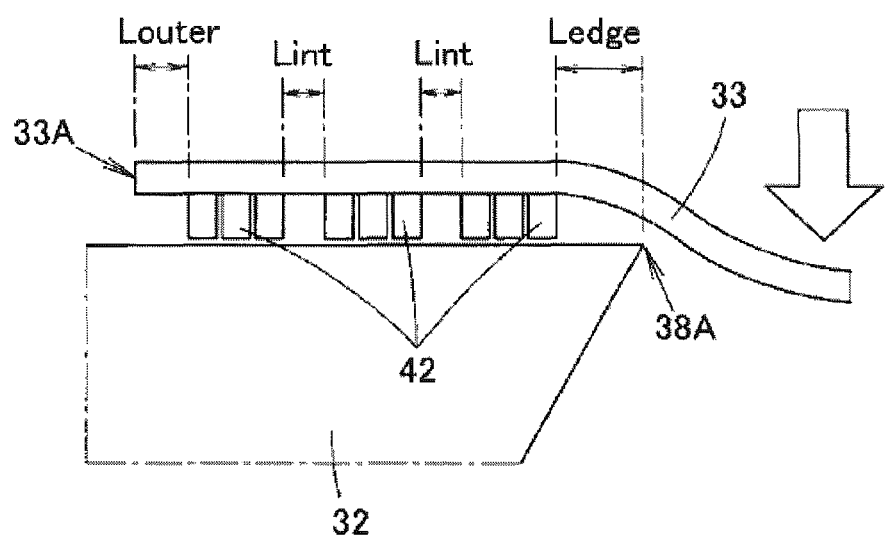
FIG. 15 is a diagram for explaining the operation and effect of the acoustic sensor according to Embodiment 1 of the present invention.

According to the arrays like Embodiment 1, as illustrated in FIG. 15, it is possible to shorten the distance Ledge between the edge 38A of the opening 38 and the projections 42 located nearest to the edge 38A of the opening 38 as viewed from a direction parallel to the edge 38A of the opening 38. Accordingly, also in a case where pressure toward the chamber 35 is applied to the diaphragm 33, the diaphragm 33 is unlikely to be pressed against the edge 38A of the opening 38, so that a mute phenomenon is unlikely to occur. In other words, limit pressure until the mute phenomenon occurs increases.

Similarly, a distance Louter between the edge 33A of the diaphragm 33 and the projections 42 located nearest to the edge 33A of the diaphragm 33 is shortened, and therefore the vicinity of the edge 33A of the diaphragm 33 is unlikely to stick to the upper surface of the silicon substrate 32.

On the other hand, the array density of the projections 42 does not change with the change of the arrays of the projections 42, and therefore the diaphragm 33 does not easily stick to the upper surface of the silicon substrate 32 between the arrays, and the projections 42 themselves do not easily stick to the upper surface of the silicon substrate 32. Additionally, it is not necessary to narrow the width W of the outer edge of the diaphragm 33, and increase the heights of the projections 42, and therefore the acoustic resistance of the acoustic sensor 31 does not reduce.

Accordingly, according to the acoustic sensor 31 of Embodiment 1 of the present invention, it is possible to prevent a mute phenomenon without lowering the characteristic of the acoustic sensor 31, and the sticking resistance of the diaphragm 33 is not lowered. Furthermore, according to Embodiment 1, the manufacturing positions of the projections are simply changed, and it is not necessary to change a process of manufacturing the acoustic sensor 11 in order to prevent a mute phenomenon.

Modification of Embodiment 1

In the acoustic sensor of the above Embodiment 1, the projections in each array are arrayed in a zigzag manner. However, the projections in a part of arrays may be arrayed in a zigzag manner.

Figure 16:
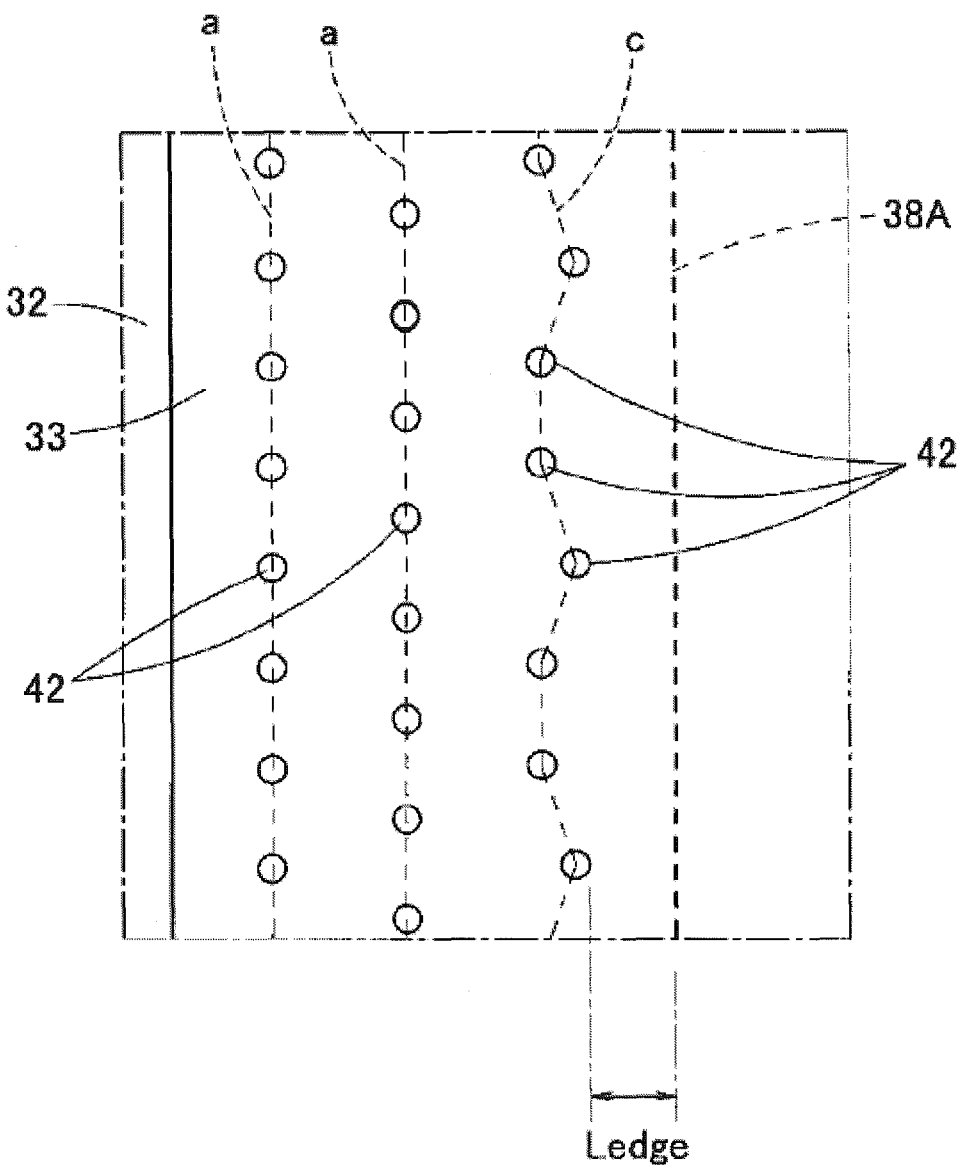
FIG. 16 is a diagram illustrating the arrangement of projections in a modification of Embodiment 1 of the present invention.

FIG. 16 illustrates a modification of Embodiment 1 of the present invention. FIG. 16 is an enlarged view of a part of the outer edge of a diaphragm 33. In this modification, only projections 42 in an array located nearest to the edge 38A of an opening 38 are arrayed in a zigzag manner. More specifically, in the array of the projections 42 located nearest to the edge 38A of the opening 38, the positions of every third projections 42 are sifted to a side close to the edge 38A of the opening 38, on the basis of the array of the projections as illustrated in FIG. 3(A).

According to such a modification, a distance Ledge between the projections 42 located nearest to the edge 38A of the opening 38 and the edge 38A of the opening 38 is shortened compared to a case of the original arrays in FIG. 3(A), and therefore a mute phenomenon is unlikely to occur. Consequently, the distance (Louter) from the edge 33A of the diaphragm 33 to each projection 42 does not increase, and therefore the sticking does not easily occur.

Figure 17:
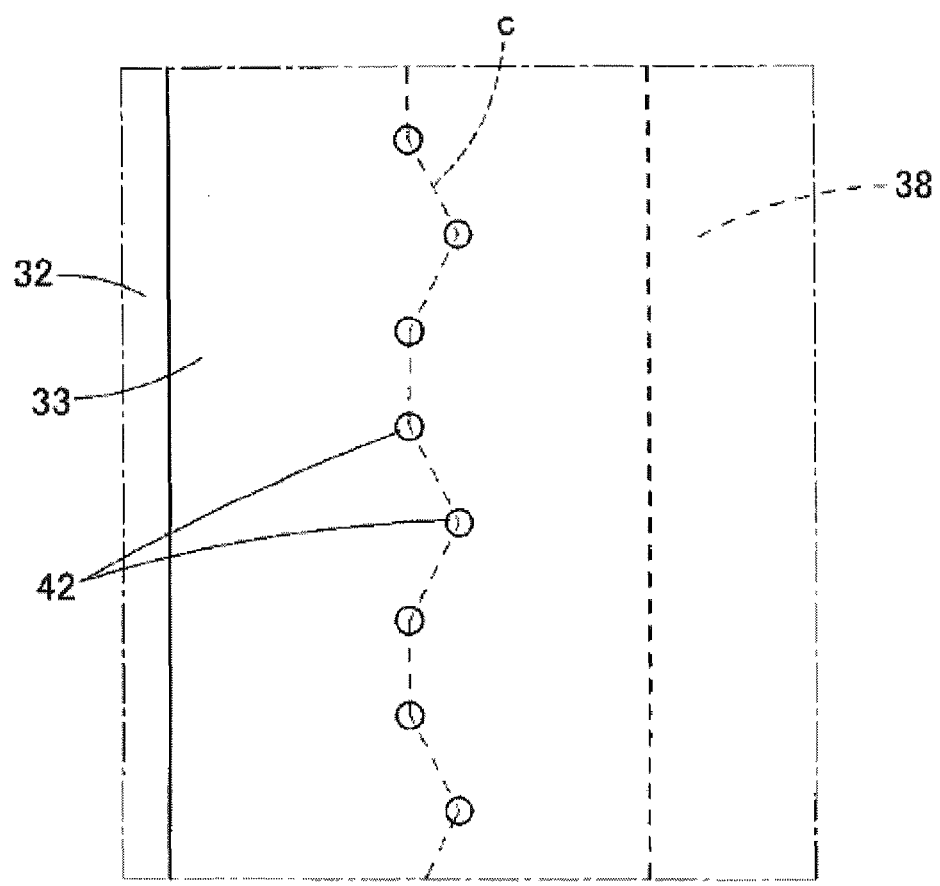
FIG. 17 is a diagram illustrating the arrangement of projections in another modification of Embodiment 1 of the present invention.

FIG. 17 illustrates another modification of Embodiment 1 of the present invention. Such a zigzag array of the projections 42 may be only a single array.

Embodiment 2

Figure 18A:
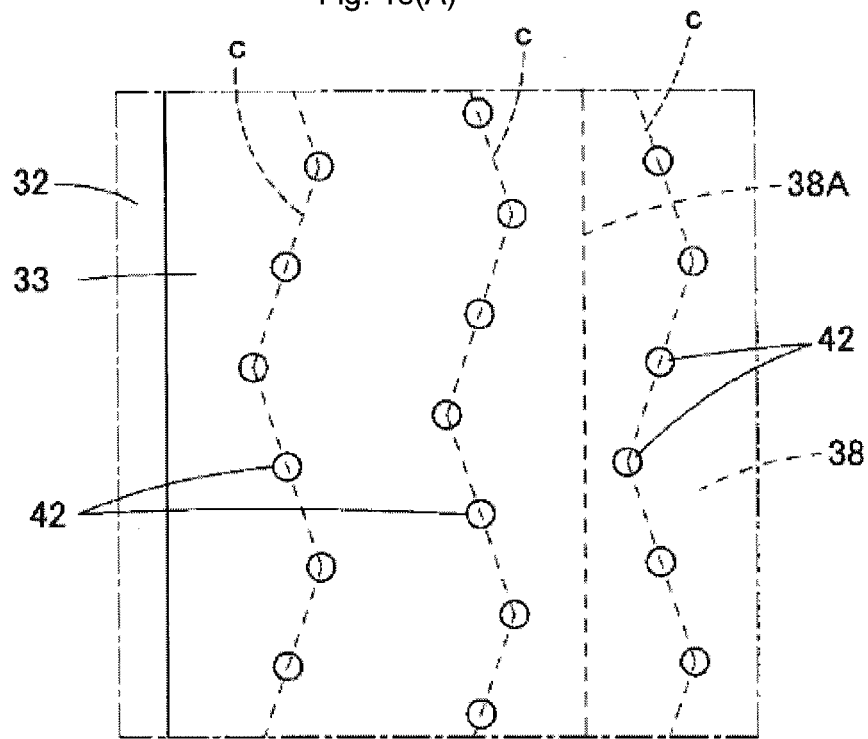
FIG. 18(A) and FIG. 18(B) are a plan view and a sectional view each illustrating the arrangement of projections in an acoustic sensor of Embodiment 2 of the present invention.
Figure 18B:
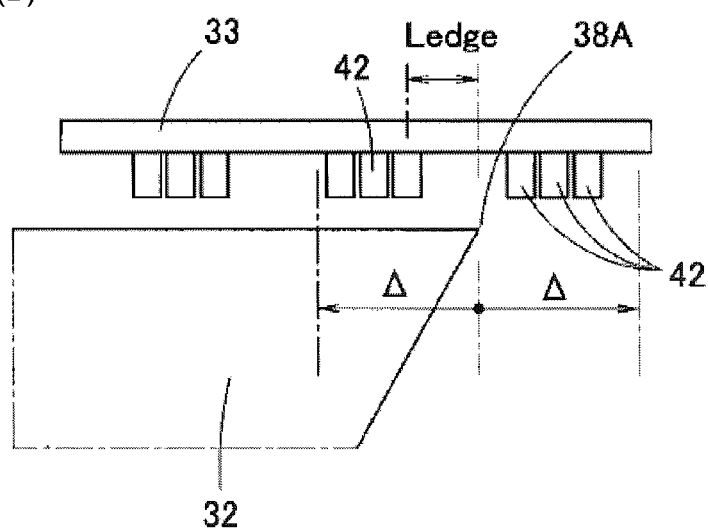

FIG. 18(A) is a plan view illustrating the arrangement of projections in an acoustic sensor of Embodiment 2 of the present invention. FIG. 18(B) is a sectional view of FIG. 18(A). In Embodiment 2, projections 42 in two or more arrays counted from the end on a side far from the edge 33A of a diaphragm 33 are arrayed in a zigzag manner. Additionally, the array of the projections 42 located farthest from the edge 33A of the diaphragm 33 is located above an opening 38 across the edge 38A of the opening 38. Accordingly, the edge 38A of the opening 38 is located between the array of the projections 42 located farthest from the diaphragm 33 and the array of the projections 42 located second farthest, as viewed from a direction perpendicular to the upper surface of the diaphragm 33.

According to such a structure, it is possible to reliably prevent the occurrence of a mute phenomenon. A chamber 35 of a silicon substrate 32 is opened by etching, and therefore there is a possibility that the position of the edge 38A of the opening 38 is shifted due to process variation such as etching variation. At this time, in a case where the projections 42 are provided only in the outer edge of the diaphragm 33, and the position of the edge 38A of the opening 38 is shifted inward, there is a risk that a distance Ledge from the edge 38A of the opening 38 to the projections 42 increases according to the extent of the shift of the edge 38A of the opening 38, and becomes larger than an interval Lint. However, in a case where the edge 38A of the opening 38 is designed so as to pass between the arrays of the projections 42 as illustrated in FIGS. 18(A) and 18(B), even when the position of the edge 38A of the opening 38 varies inside or outside across any array of the array of the projections 42 located inside the edge 38A and the array of the projections 42 located outside the edge 38A, the distances Ledge from the edge 38A of the opening 38 to the projections 42 does not become larger than the interval Lint between the arrays of the projections 42 within the limitation of the variation of the edge 38A of the opening 38. In addition, when the projections 42 are arranged in the zigzag manner, the interval Lint between the arrays is shortened. Accordingly, it is secured that the distance Ledge between the edge 38A of the opening 38 and each projection 42 is always shortened, and it is possible to suppress the occurrence of a mute phenomenon. That is, it is possible to absorb the variation in processes performed when the chamber is opened in the silicon substrate. In FIG. 18(B), A denotes the variation limitation of the edge 38A of the opening 38.

Embodiment 3

Figure 19A:
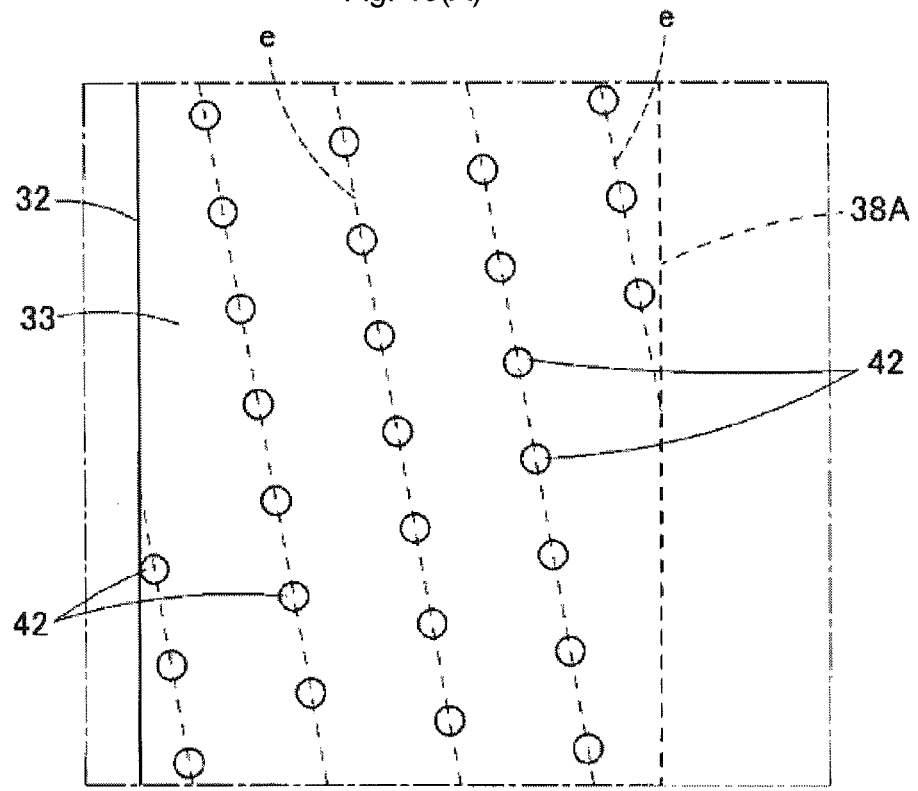
FIG. 19(A) and FIG. 19(B) are a plan view and a sectional view each illustrating the arrangement of projections in an acoustic sensor of Embodiment 3 of the present invention.
Figure 19B:
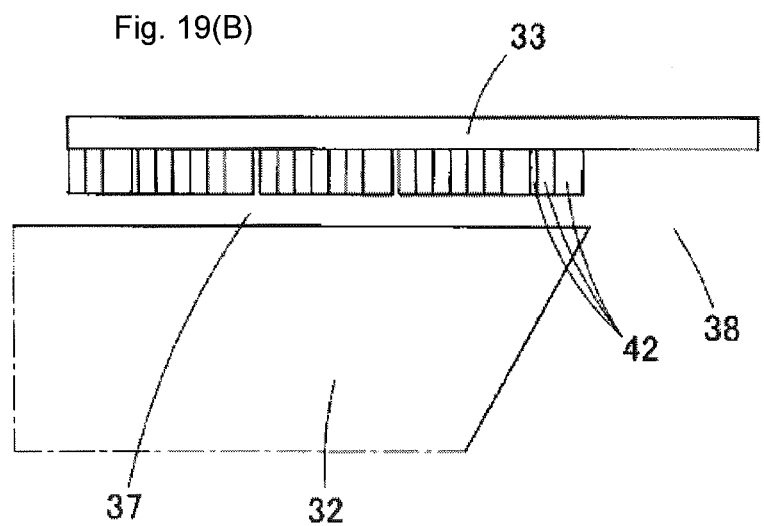

FIG. 19(A) and FIG. 19(B) are a plan view and a sectional view each illustrating the arrangement of projections in an acoustic sensor according to Embodiment 3 of the present invention. In Embodiment 3, projections 42 are arrayed on each of straight lines e obliquely inclined to the edge 38A of an opening 38 (straight lines nonparallel to the edge of the opening).

According to the arrays of the projections 42 like Embodiment 3, it is possible to shorten a distance Ledge between the projections 42 located nearest to the edge 38A of the opening 38 and the edge 38A of the opening 38, and therefore it is possible to more reliably prevent the occurrence of a mute phenomenon.

Modification of Embodiment 3

Figure 20:
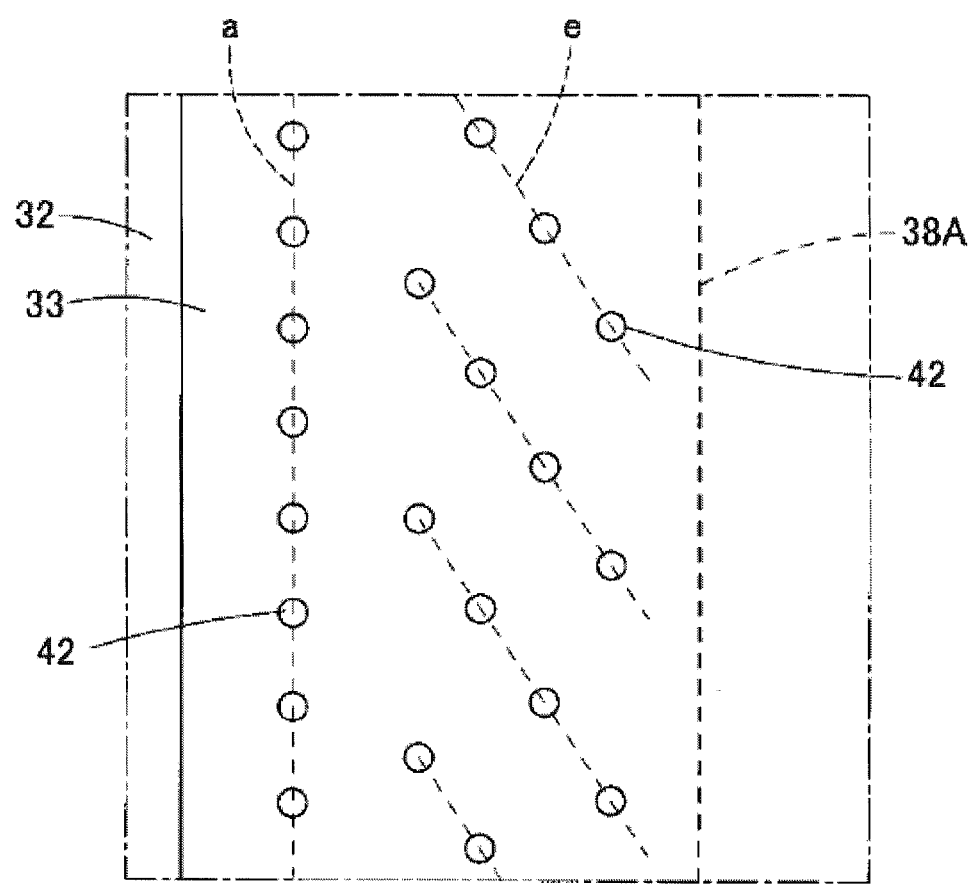
FIG. 20 is a plan view illustrating the arrangement of projections in a modification of Embodiment 3 of the present invention.

FIG. 20 is a plan view illustrating the arrangement of projections in a modification of Embodiment 3 of the present invention. In this modification, the array of projections 42 that are arranged on a straight line parallel to the edge 38A of an opening 38, and the arrays of projections 42 that are arrayed on straight lines e obliquely inclined to the edge 38A of the opening 38 are mixed.

Embodiment 4

Figure 21:
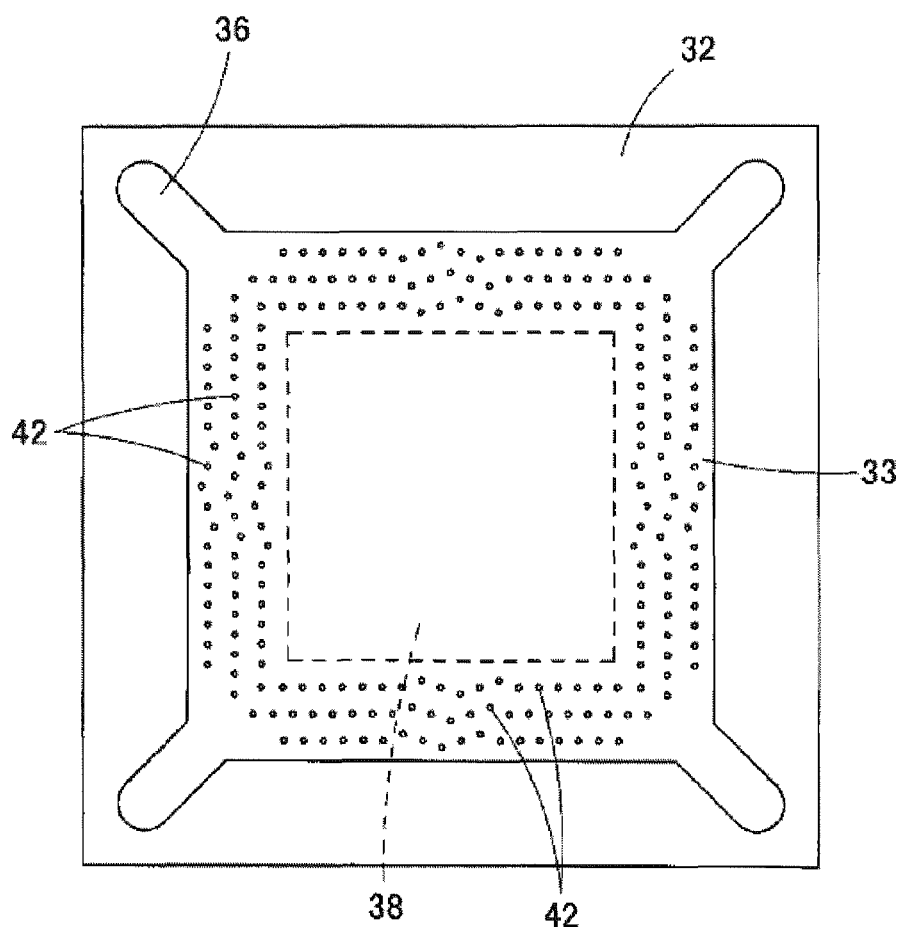
FIG. 21 is a plan view illustrating a diaphragm arranged on the upper surface of a silicon substrate in an acoustic sensor of Embodiment 4 of the present invention.
Figure 22:
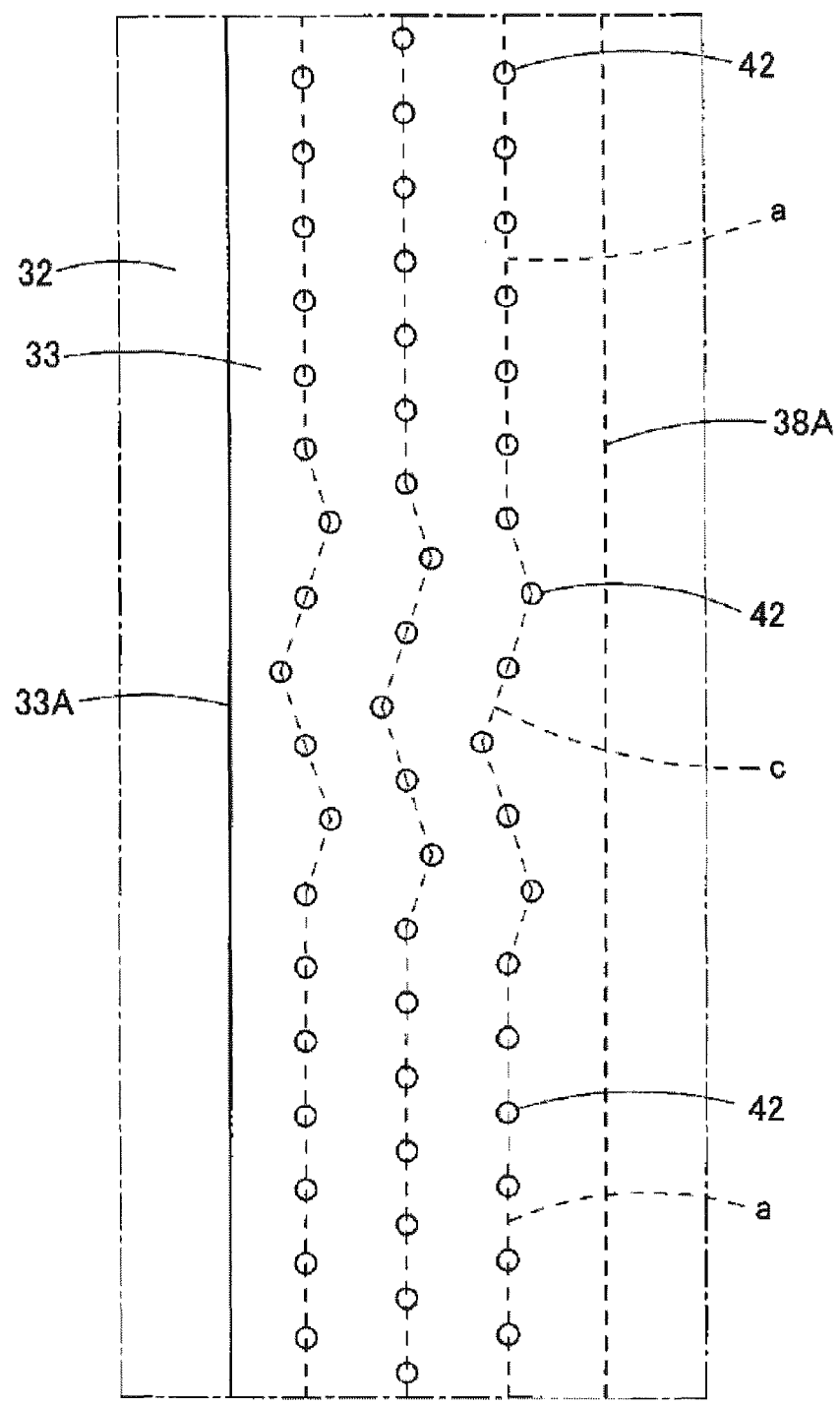
FIG. 22 is an enlarged plan view of a side of the outer edge of a diaphragm in the acoustic sensor of FIG. 21.

In Embodiment 4, different array patterns are mixed in a single array. FIG. 21 and FIG. 22 each illustrate such an example. FIG. 21 is a plan view illustrating a diaphragm 33 arranged on the upper surface of a silicon substrate 32 in an acoustic sensor of Embodiment 4 of the present invention. FIG. 22 is an enlarged plan view of a side of the outer edge of the diaphragm 33 in the acoustic sensor of FIG. 21. In this Embodiment 4, a part of a plurality of projections 42 connected at the shortest distance are arranged on a straight line a that is a part of an array, and the other of the projections 42 are arranged on a zigzag line c that is a part of the array. Particularly, FIG. 21 and FIG. 22, in each side of the outer edge of the diaphragm 33, the projections 42 are arrayed in a zigzag manner at the center of the side, and linearly arrayed at ends of the side. The diaphragm 33 is most likely to hit the edge 38A of the opening 38 at the center of each side, and therefore even when only the projections 42 located at the center are arrayed in the zigzag manner, a mute prevention effect is obtained.

Embodiment 5

Figure 23:
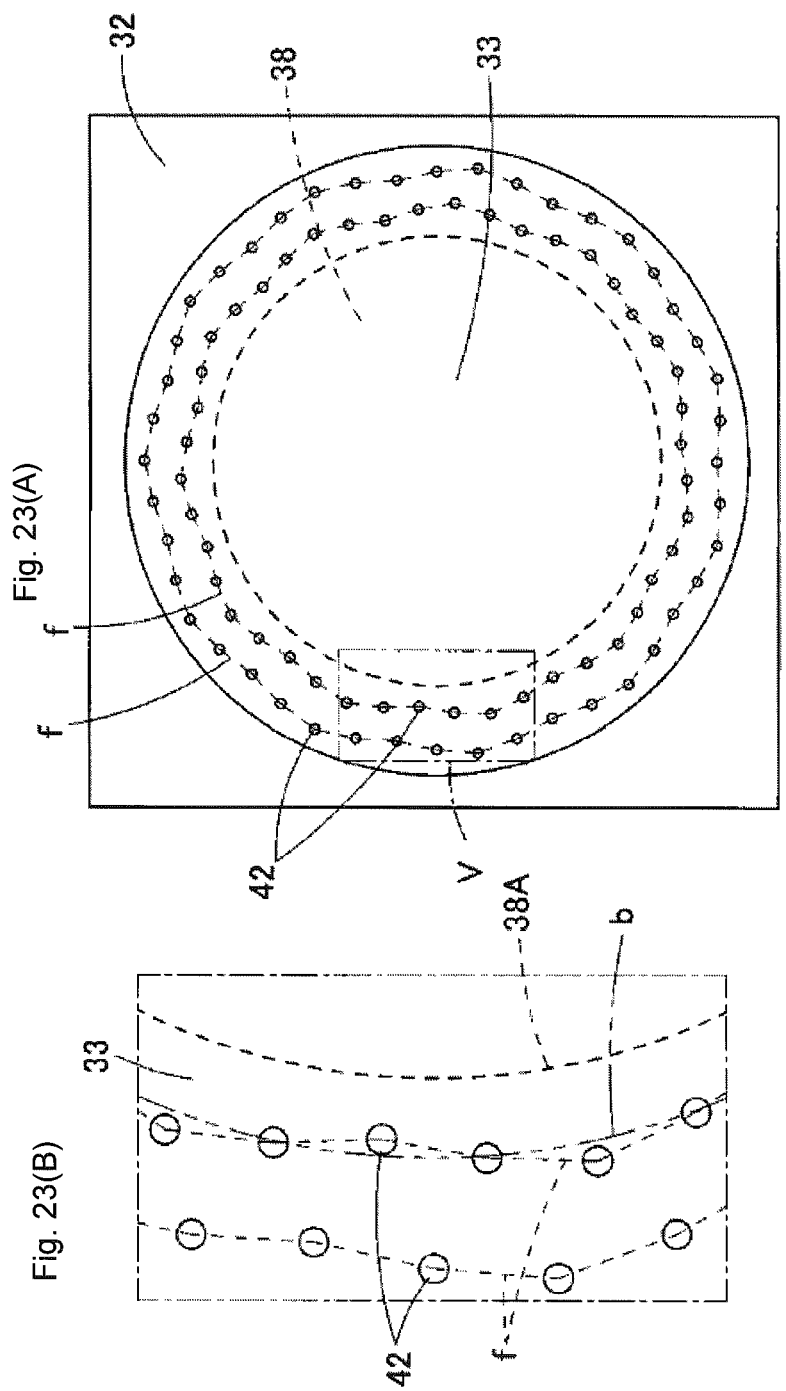
FIG. 23(A) is a plan view illustrating a diaphragm arranged on the upper surface of a silicon substrate in an acoustic sensor of Embodiment 5 of the present invention.
FIG. 23(B) is an enlarged plan view of a part of V in FIG. 23(A).

FIG. 23(A) is a plan view illustrating a diaphragm 33 arranged on the upper surface of a silicon substrate 32 in an acoustic sensor of Embodiment 5 of the present invention. FIG. 23(B) is an enlarged plan view of a part of V in FIG. 23(A). In Embodiment 5, an opening 38 in the upper surface of the silicon substrate 32 is circular, and the diaphragm 33 provided above the opening is also circular. In Embodiment 5, projections 42 that are connected at the shortest distance to form each of arrays are arranged on an annular zigzag line f bent in a zigzag manner. FIG. 23(B) illustrates arcs b parallel to the edge 38A of an opening of an opening 38, namely the arcs b (circles) located at a constant distance from the edge 38A of the opening 38 over the whole circumference. Every second projections 42 are shifted to the center and the outside to form a zigzag with respect to the position of each arc b parallel to the edge 38A of the opening 38, and distances from the opening end of the opening 38 to the projections 42 are not constant, and vary along the circumferential direction.

Embodiment 6

Figure 24:
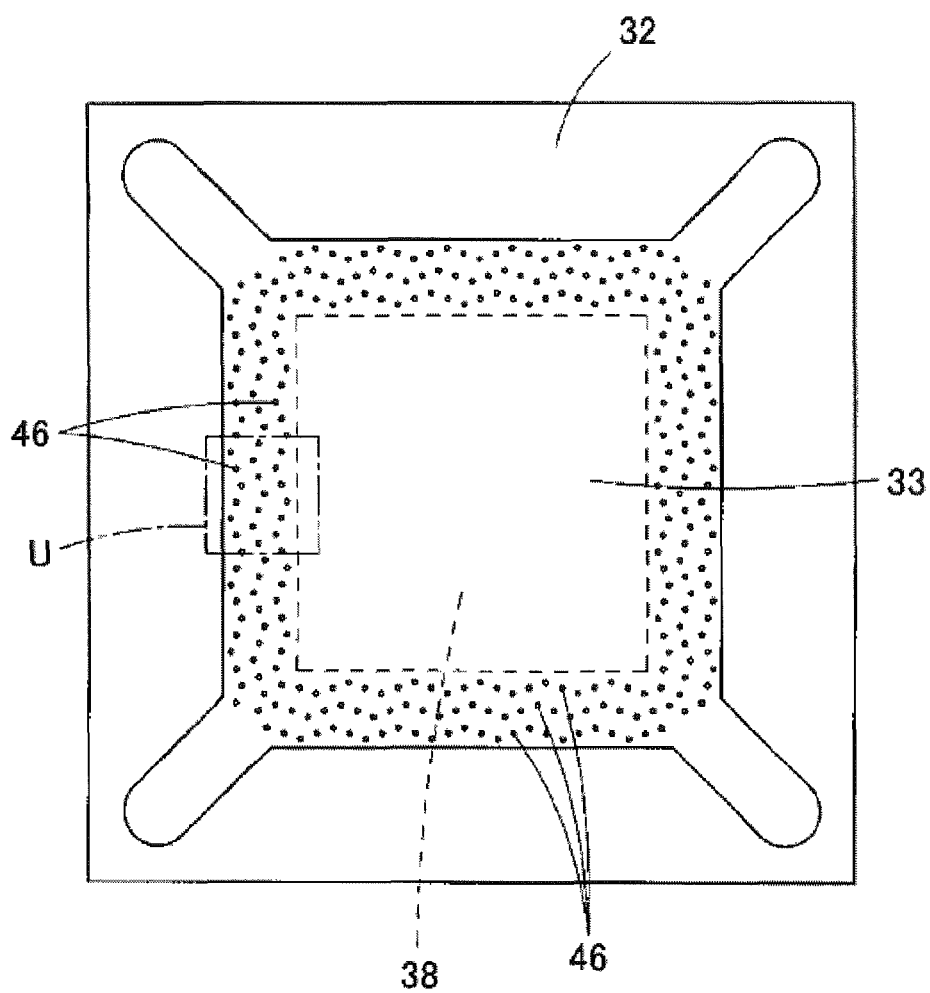
FIG. 24 is a plan view illustrating a diaphragm arranged on the upper surface of a silicon substrate in an acoustic sensor of Embodiment 6 of the present invention.
Figure 25A:
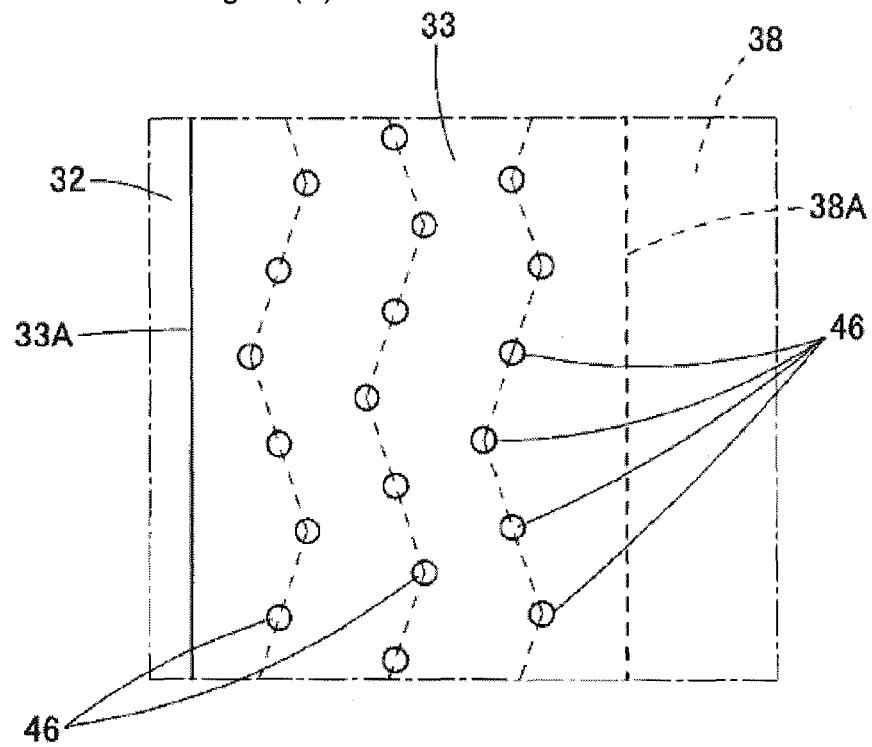
FIG. 25(A) is an enlarged plan view of a part of U in FIG. 24.
Figure 25B:
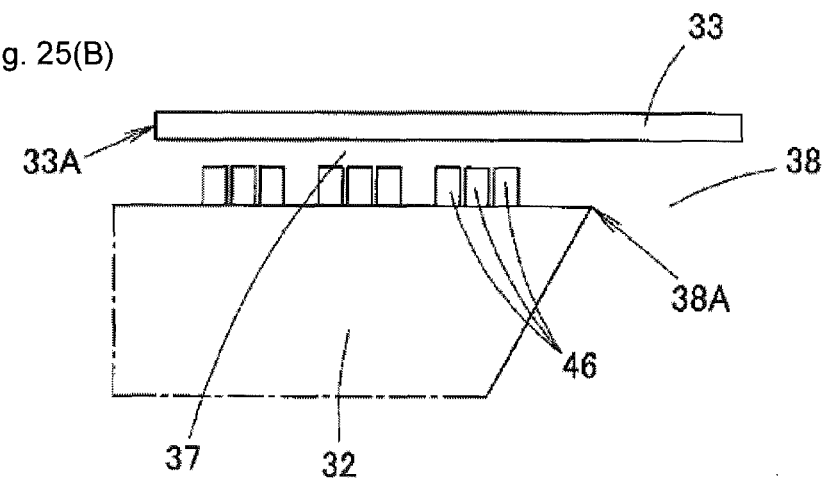
FIG. 25(B) is a sectional view of FIG. 25(A).

FIG. 24 is a plan view illustrating a diaphragm 33 arranged on the upper surface of a silicon substrate 32 in an acoustic sensor of Embodiment 6 of the present invention. FIG. 25(A) is an enlarged plan view of a part of U in FIG. 24. FIG. 25(B) is a sectional view of FIG. 25(A). In Embodiment 6, a plurality of projections 46 are provided on the upper surface of the silicon substrate 32 so as to face the outer edge lower surface of the diaphragm 33. These projections 46 in at least a part of arrays are not arranged parallel to the edge 38A of the opening 38, similarly to the projections 42 provided on the lower surface of the diaphragm 33. In FIG. 24 and FIG. 25(A), segments, each of which connects the projections 46 at the shortest distance, form zigzag lines c similar to the lines in FIG. 14(A). However, the segments may form arrays similar to other arrays of the projections 42.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

31 Acoustic sensor
32 Silicon substrate
33 Diaphragm
33A Edge of diaphragm
35 Chamber
37 Vent hole
38 Opening
38A Edge of opening
42 Projection
Ledge Distance from edge of opening to nearest projection
Lint Shortest interval between adjacent projection arrays
Louter Distance from edge of diaphragm to nearest projection
W Width of outer edge of diaphragm

The invention claimed is:
1. An acoustic transducer comprising:
a substrate having an opening in an upper surface thereof;
a vibration electrode plate disposed above the substrate, and having an outer edge thereof facing the upper surface of the substrate with a gap therebetween;
a fixed electrode plate facing the vibration electrode plate; and
a plurality of projections protruding on a lower surface of the outer edge of the vibration electrode plate,
wherein the vibration electrode plate covers an upper side of the opening, and
wherein the plurality of projections are disposed so as to not be positioned along a straight line or a curved line parallel to an edge of the opening in at least a part of one or at least two arrays formed on the lower surface of the outer edge.

2. The acoustic transducer according to claim 1,
wherein, in the array in which the projections are not arranged along the straight line or the curved line parallel to the edge of the opening, distances measured from the edge of the opening to respective projections are not constant.

3. The acoustic transducer according to claim 1,
wherein, in the array in which the projections are not arranged along the straight line or the curved line parallel to the edge of the opening, the one or at least two projections are present between the projection located nearest to the edge of the opening and the projection located farthest from the edge of the opening.

4. The acoustic transducer according to claim 1,
wherein at least one of adjacent two projections of the projections in a same array is located at the shortest distance among all the projections provided on the vibration electrode plate as viewed from the other of the adjacent two projections.

5. The acoustic transducer according to claim 1,
wherein a projection protrudes also in a region, facing the opening, of a lower surface of the vibration electrode plate.

6. The acoustic transducer according to claim 1,
wherein a plurality of arrays comprising the projections are formed,
wherein projections that configure an array located nearest to the edge of the opening are not arranged along the straight line or the curved line parallel to the edge of the opening, and
wherein projections that configure an array other than the array located nearest to the edge of the opening are arranged along the straight line or the curved line parallel to the edge of the opening.

7. The acoustic transducer according to claim 1,
wherein, in the array in which the projections are not arranged along the straight line or the curved line parallel to the edge of the opening, a part of the projections is not arranged along the straight line or the curved line parallel to the edge of the opening, and remaining projections are arranged along the straight line or the curved line parallel to the edge of the opening.

8. The acoustic transducer according to claim 1,
wherein, in the array in which the projections are not arranged along the straight line or the curved line parallel to the edge of the opening, the projections are meanderingly arranged in a zigzag manner.

9. The acoustic transducer according to claim 1,
wherein, in the array in which the projections are not arranged along the straight line or the curved line parallel to the edge of the opening, the projections are arranged along a straight line extending in a direction inclined to the edge of the opening.

10. The acoustic transducer according to claim 1,
wherein the opening of the substrate is formed in a rectangular shape or a polygonal shape, and
wherein, in at least a part of the array, the projections are not arranged along a straight line parallel to each of sides of the rectangular shape or the polygonal shape that is the edge of the opening.

11. The acoustic transducer according to claim 1,
wherein the opening of the substrate is formed in a circular shape, and
wherein, in at least a part of the array, the projections are not arranged along an arc parallel to a circumference of the circular shape that is the edge of the opening.

12. The acoustic transducer according to claim 1,
wherein a distance between the edge of the opening and the edge of the vibration electrode plate is constant along the edge of the opening.

13. An acoustic transducer comprising:
a substrate having an opening in an upper surface thereof;
a vibration electrode plate disposed above the substrate, and having an outer edge thereof facing the upper surface of the substrate with a gap therebetween;
a fixed electrode plate facing the vibration electrode plate; and
a plurality of projections protruding in a region, facing the outer edge of the vibration electrode film, of the surface of the substrate,
wherein the vibration electrode plate covers an upper side of the opening, and
wherein the plurality of projections disposed so as to not be positioned along a straight line or a curved line parallel to an edge of the opening in at least a part of one or at least two arrays formed on the upper surface of the substrate.

* * * * *